(12) United States Patent
Jimbo et al.

(10) Patent No.: US 12,307,643 B2
(45) Date of Patent: May 20, 2025

(54) PROCESSING APPARATUS, MEASUREMENT APPARATUS, LITHOGRAPHY APPARATUS, METHOD OF MANUFACTURING ARTICLE, MODEL, PROCESSING METHOD, MEASUREMENT METHOD, GENERATION METHOD, AND GENERATION APPARATUS

(71) Applicant: CANON KABUSHIKI KAISHA, Tokyo (JP)

(72) Inventors: Satoru Jimbo, Tochigi (JP); Yoshio Suzaki, Tochigi (JP); Kazuhiko Mishima, Tochigi (JP); Noburu Takakura, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 772 days.

(21) Appl. No.: 17/502,514

(22) Filed: Oct. 15, 2021

(65) Prior Publication Data

US 2022/0130028 A1    Apr. 28, 2022

(30) Foreign Application Priority Data

Oct. 22, 2020  (JP) .................................. 2020-177445
Sep. 1, 2021   (JP) .................................. 2021-142700

(51) Int. Cl.
*G06T 7/00*   (2017.01)
*G03F 1/70*   (2012.01)
(Continued)

(52) U.S. Cl.
CPC .............. *G06T 7/0004* (2013.01); *G03F 1/70* (2013.01); *G06N 20/00* (2019.01); *G06T 7/73* (2017.01);
(Continued)

(58) Field of Classification Search
CPC ..................... G06T 7/0004; G06T 7/73; G06T 2207/20081; G06T 2207/30148; G03F 1/70; G06N 20/00
See application file for complete search history.

(56) References Cited

U.S. PATENT DOCUMENTS 5,543,921 A      8/1996   Uzawa et al.
5,831,739 A *   11/1998   Ota ....................... G03F 9/7092
                                                          250/548
(Continued)

FOREIGN PATENT DOCUMENTS

JP     862215805 A    9/1987
JP     H02294015 A   12/1990
(Continued)

OTHER PUBLICATIONS

Office action issued in Taiwanese Appln. No. 110137269 dated Mar. 21, 2024. English translation provided.
(Continued)

*Primary Examiner* — Hung V Nguyen
(74) *Attorney, Agent, or Firm* — ROSSI, KIMMS & McDOWELL LLP

(57) ABSTRACT

The present invention provides a processing apparatus comprising: a generator configured to generate, based on image data of a measurement target, position information of the measurement target in a first direction; and a determinator configured to determine, based on a feature quantity of the image data related to a second direction different from the first direction, confidence of the position information of the measurement target generated by the generator.

25 Claims, 20 Drawing Sheets

(51) Int. Cl.
*G06N 20/00* (2019.01)
*G06T 7/73* (2017.01)

(52) U.S. Cl.
CPC ............... *G06T 2207/20081* (2013.01); *G06T 2207/30148* (2013.01)

(56) References Cited

U.S. PATENT DOCUMENTS

| | | |
|---|---|---|
| 7,493,185 B2 | 2/2009 | Cheng |
| 11,129,319 B2 * | 9/2021 | Ono ........................ G06T 7/73 |
| 11,567,419 B2 | 1/2023 | Ueda |
| 2019/0033555 A1 | 1/2019 | Lee |

FOREIGN PATENT DOCUMENTS

| | | |
|---|---|---|
| JP | 4601492 B2 | 12/2010 |
| TW | 201637119 A | 10/2016 |

OTHER PUBLICATIONS

Office Action issued in Chinese Appln. No. 202111214067.1, mailed Mar. 24, 2025.

\* cited by examiner

SCATTERED LIGHT BY IL 3 AND 4 x SECTION

SCATTERED LIGHT BY IL 3 AND 4

SCATTERED LIGHT BY IL 1 AND 2

SCATTERED LIGHT BY IL 1 AND 2

SCATTERED LIGHT

INTENSITY

X

F I G. 14D
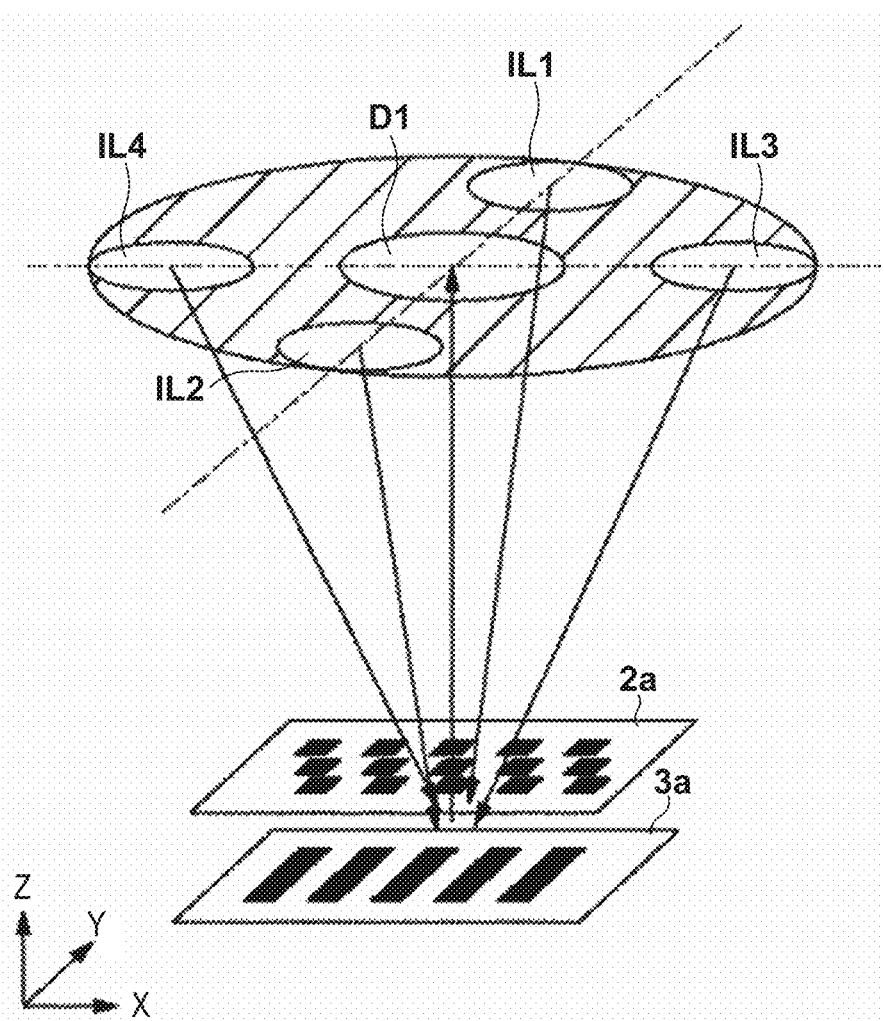

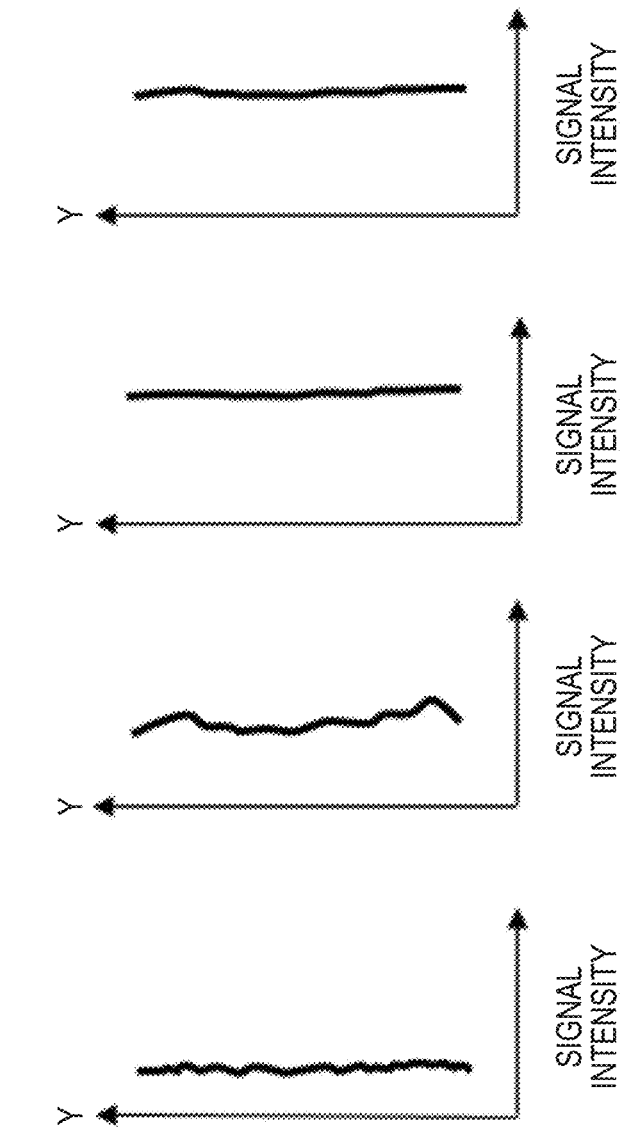
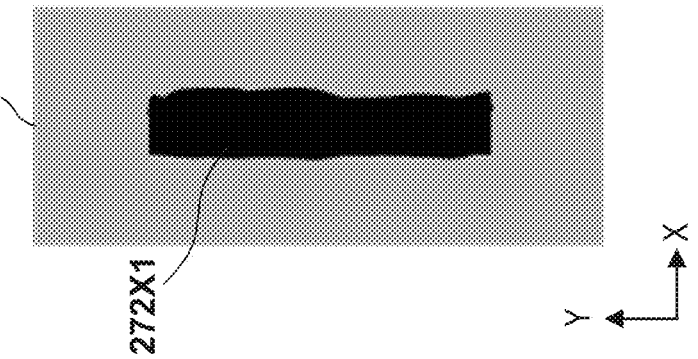
FIG. 21A FIG. 21B FIG. 21C FIG. 21D FIG. 21E

PROCESSING APPARATUS, MEASUREMENT APPARATUS, LITHOGRAPHY APPARATUS, METHOD OF MANUFACTURING ARTICLE, MODEL, PROCESSING METHOD, MEASUREMENT METHOD, GENERATION METHOD, AND GENERATION APPARATUS

BACKGROUND OF THE INVENTION

Field of the Invention

The present invention relates to a processing apparatus, a measurement apparatus, a lithography apparatus, a method of manufacturing an article, a model, a processing method, a measurement method, a generation method, and a generation apparatus.

Description of the Related Art

In a lithography process for manufacturing an article such as a semiconductor device or the like, a lithography apparatus such as an imprint apparatus, an exposure apparatus, or the like can be used. A lithography apparatus can transfer a pattern of an original to a shot region of a substrate. An imprint apparatus brings a mold into contact with an imprint material arranged on a shot region of a substrate and cures the imprint material to form a pattern made of a cured product of the imprint material on the shot region. Also, an exposure apparatus can project a pattern of an original to a shot region of a substrate coated with a photosensitive material to form a latent pattern of the original on the photosensitive material. The latent image is converted into a physical pattern by a development process. To accurately transfer a pattern of an original to a substrate (shot region), such lithography apparatuses need to accurately align the substrate and the original (see Japanese Patent No. 4601492).

The alignment of a substrate and an original can be performed by capturing an image of, for example, marks as measurement targets provided on the substrate and/or the original, and obtaining the position information of the marks from the image data obtained by the image capturing. However, a mark (abnormal mark) which is not formed in an actually intended shape or position may be present on the substrate and/or the original. It can be difficult to accurately perform alignment if the position information of such an abnormal mark is directly used.

SUMMARY OF THE INVENTION

The present invention provides, for example, a technique advantageous in appropriately using the position information of a measurement target.

According to one aspect of the present invention, there is provided a processing apparatus comprising: a generator configured to generate, based on image data of a measurement target, position information of the measurement target in a first direction; and a determinator configured to determine, based on a feature quantity of the image data related to a second direction different from the first direction, confidence of the position information of the measurement target generated by the generator.

Further features of the present invention will become apparent from the following description of exemplary embodiments with reference to the attached drawings.

BRIEF DESCRIPTION OF THE DRAWINGS

FIGS. 14A to 14D are views for explaining a moiré measurement system;

FIGS. 21A to 21E are views showing an example of the arrangement of an alignment mark and a signal waveform (in a non-measurement direction) obtained from image data of the alignment mark.

DESCRIPTION OF THE EMBODIMENTS

Figure 1:
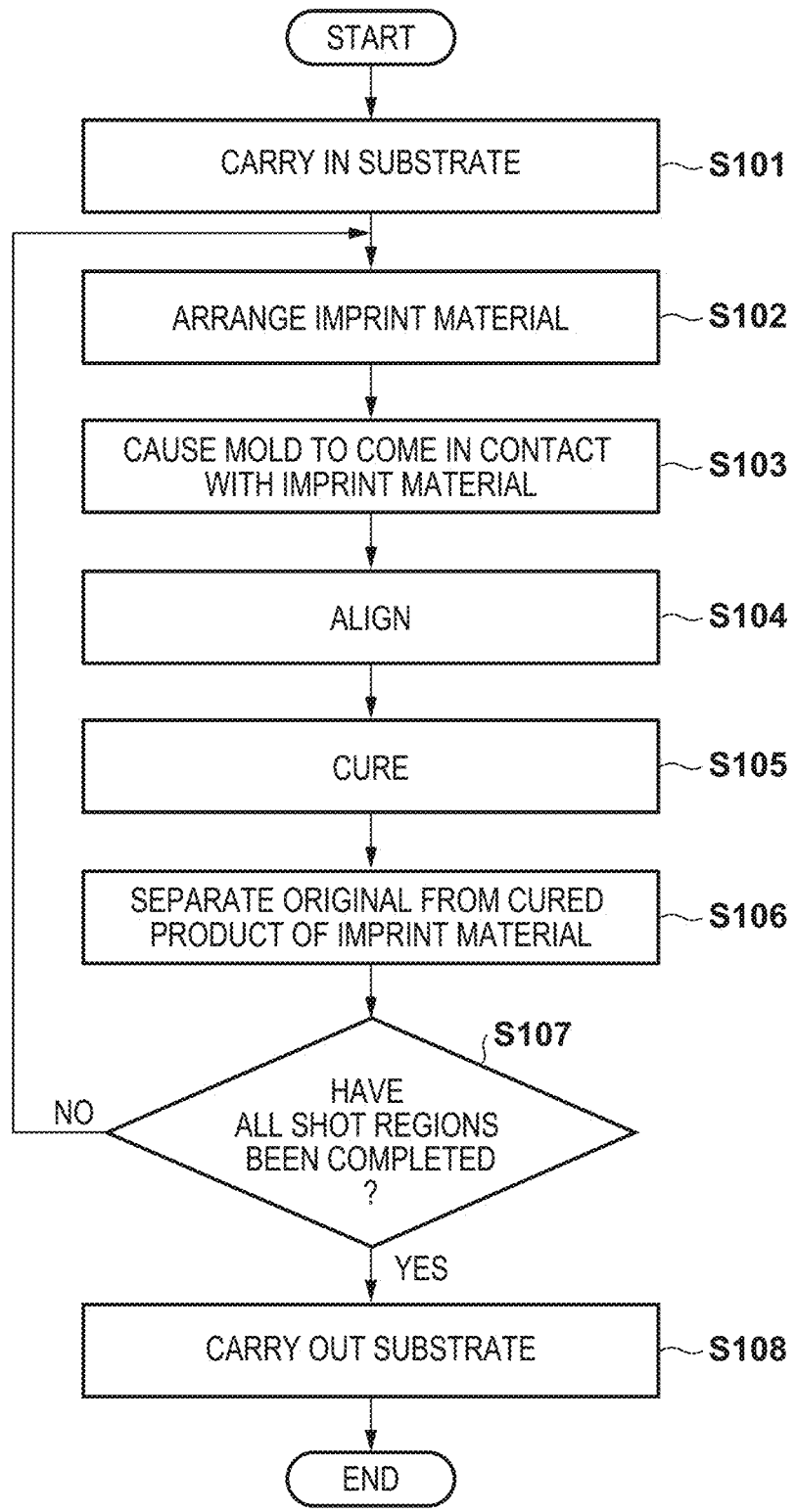
FIG. 1 is a flowchart showing an example of an operation of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The first embodiment of the present invention will be described. Although an imprint apparatus will be described as an example of a lithography apparatus in the first embodiment, there are many commonalities between an imprint apparatus and an exposure apparatus in regards to a technique for aligning an original and a shot region of a substrate. Hence, an alignment technique to be described below is also applicable to an exposure apparatus. In addition, the alignment technique to be described below is not only applicable to an exposure apparatus, but also applicable to a measuring device that does not have an exposure function.

Figure 2A:
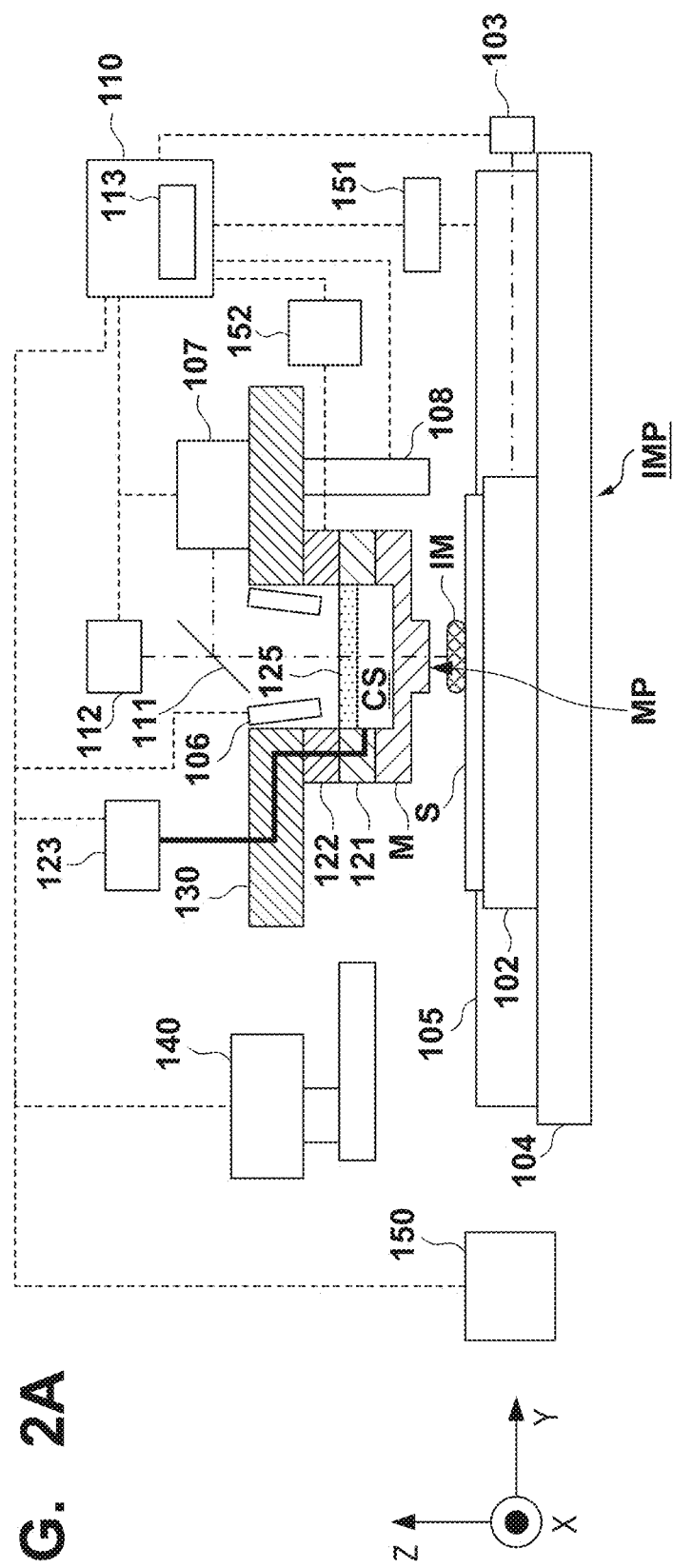
FIGS. 2A and 2B are views each showing an example of the arrangement of the imprint apparatus.

FIG. 2A schematically shows the arrangement of an imprint apparatus IMP according to an embodiment. The imprint apparatus IMP performs an imprint process in which an imprint material IM is cured in a state in which the imprint material IM on a shot region of a substrate S and a pattern region MP of a mold M are in contact with each other, and a cured product of the imprint material IM and the mold M are subsequently separated from each other. A pattern made of a cured product of the imprint material IM is formed on the shot region of the substrate S by this imprint process.

As the imprint material, a curable composition (to be also referred to a resin in an uncured state) to be cured by receiving curing energy is used. As the curing energy, an electromagnetic wave or heat can be used. The electromagnetic wave can be, for example, light selected from the wavelength range of 10 nm or more to 1 mm or less, for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The viscosity (the viscosity at 25° C.) of the imprint material can be, for example, 1 mPa·s or more to 100 mPa·s or less. As the material of the substrate, for example, glass, a ceramic, a metal, a semiconductor, a resin, or the like can be used. A member made of a material different from the substrate may be provided on the surface of the substrate, as needed. The substrate is, for example, a silicon wafer, a compound semiconductor wafer, or silica glass.

In the specification and the accompanying drawings, directions will be indicated on an XYZ coordinate system in which directions parallel to the surface of the substrate S are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment can include controlling the position and/or orientation of at least one of the substrate and the mold.

The imprint apparatus IMP can include a substrate holder 102 that holds the substrate S, a substrate driving mechanism 105 that drives the substrate S by driving the substrate holder 102, a base 104 that supports the substrate holder 102, and a position measuring device 103 that measures the position of the substrate holder 102. The substrate driving mechanism 105 can include, for example, a motor such as a linear motor or the like. The imprint apparatus IMP can include a sensor 151 that measures a substrate driving force (alignment load) necessary for the substrate driving mechanism 105 to drive the substrate S (substrate holder 102) during alignment. The substrate driving force required in an alignment operation, which is performed in a state in which the imprint material IM on the substrate S and the pattern region MP of the mold M are in contact with each other, corresponds to a shear force that acts between the substrate S and the mold M. The shear force is mainly a force that acts on the substrate S and the mold M in a plane direction. The substrate driving force during alignment is, for example, correlated to the magnitude of a current supplied to the motor of the substrate driving mechanism 105 during alignment, and the sensor 151 can measure the substrate driving force based on the magnitude of the current. The sensor 151 is an example of a sensor for measuring the influence (shear force) received by the mold M during pattern formation. In addition, a driving request (command value) output from a controller 110 (to be described later) to the substrate driving mechanism 105 will be referred to as a stage control value.

The imprint apparatus IMP can include a mold holder 121 that holds the mold M which serves as an original, a mold driving mechanism 122 that drives the mold M by driving the mold holder 121, and a support structure 130 that supports the mold driving mechanism 122. The mold driving mechanism 122 can include, for example, a motor such as a voice coil motor or the like. The imprint apparatus IMP can include a sensor 152 that measures a mold releasing force (separation load) and/or a pressing force. A mold releasing force is a force necessary for separating the cured product of the imprint material IM on the substrate S and the mold M from each other. A pressing force is a force for pressing the mold M to make the mold M contact the imprint material IM on the substrate S. The mold releasing force and the pressing force are forces that mainly act on a direction perpendicular to a plane direction of the substrate S and the mold M. The mold releasing force and the pressing force are, for example, correlated to the magnitude of a current supplied to the motor of the mold driving mechanism 122, and the sensor 152 can measure the mold releasing force and the pressing force based on the magnitude of the current. The sensor 152 is an example of a sensor for measuring the influence(s) (the mold releasing force and/or the pressing force) received by the mold M during the pattern formation. In addition, a driving request (command value) output from the controller 110 (to be described later) to the mold driving mechanism 122 will also be referred to as a stage control value.

The substrate driving mechanism 105 and the mold driving mechanism 122 form a driving mechanism for adjusting a relative position and a relative posture between the substrate S and the mold M. The adjustment of the relative position between the substrate S and the mold M includes a driving operation to bring the mold into contact with the imprint material on the substrate S and a driving operation to separate the mold from the cured imprint material (a pattern made of the cured product). The substrate driving mechanism 105 can be configured to drive the substrate S about a plurality of axes (for example, three axes including the X-axis, Y-axis, and θZ-axis, and preferably six axes including the X-axis, Y-axis, Z-axis, θX-axis, θY-axis, and θZ-axis). The mold driving mechanism 122 can be configured to drive the mold M about a plurality of axes (for example, three axes including the Z-axis, θX-axis, and θY-axis, and preferably six axes including the X-axis, Y-axis, Z-axis, θX-axis, θY-axis, and θZ-axis).

The imprint apparatus IMP can include a mold cleaner 150 and a mold conveyance mechanism 140 for conveying the mold M. The mold conveyance mechanism 140 can be configured, for example, to convey the mold M to the mold holder 121 and to convey the mold M from the mold holder 121 to an original stocker (not shown) or the mold cleaner 150. The mold cleaner 150 will clean the mold M by using ultraviolet light, a chemical solution, and the like.

Figure 2B:
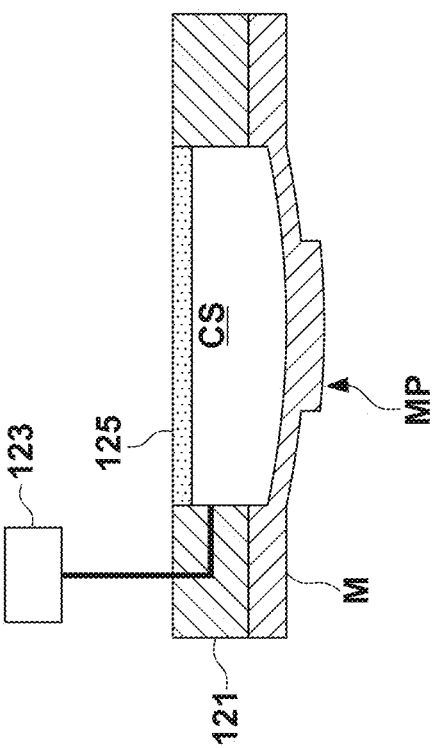

The mold holder 121 can include a window member 125 that forms a pressure-controlled space CS on the side of a reverse surface (a surface on a side opposite to the pattern region MP on which the pattern to be transferred to the substrate S is formed) of the mold M. The imprint apparatus IMP can include a deformation mechanism 123 that controls the pressure (to be referred to as a cavity pressure hereinafter) of the pressure-controlled space CS to deform the pattern region MP of the mold M into a convex shape toward the substrate S as schematically shown in FIG. 2B. In addition, the imprint apparatus IMP can include an alignment measuring device (an alignment measuring device and an image capturing device) 106, a curing device 107, an observation device 112, and an optical member 111.

The alignment measuring device 106 can illuminate a first mark of the substrate S (first member) and a second mark of the mold M (second member) and generate image data by capturing an image of moiré fringes (measurement target) as an optical image formed by the first mark and the second mark. Note that each mark used for alignment can be called an alignment mark. The alignment measuring device 106 or the controller 110 can detect relative position information between the first mark and the second mark by processing the image data generated by image capturing. The alignment measuring device 106 can be positioned by a driving mechanism (not shown) in accordance with the position of the alignment mark to be observed.

The alignment measuring device 106 may also measure the relative position information of the first mark and the second mark here without using the moiré fringes formed by the first mark and the second mark. For example, in a case in which a box-in-box mark is formed by the first mark and the second mark, the alignment measuring device 106 can measure the relative position information of the first mark and the second mark by processing the image data generated by capturing an image of the box-in-box mark. The alignment measuring device 106 may also individually measure the position information of each first mark and/or the position information of each second mark. Image data generated by image capturing by the alignment measuring device 106 will also be referred to as an alignment image hereinafter. In addition, a result of measurement by the alignment measuring device 106 may also be referred to as an alignment measurement value.

The curing device 107 irradiates the imprint material IM with an energy (for example, light such as ultraviolet light) for curing the imprint material IM via the optical member 111, and cures the imprint material IM with this energy. The observation device 112 observes the state of the imprint material IM by capturing an image of the substrate S, the mold M, and the imprint material IM via the optical member 111 and the window member 125. Image data obtained by image capturing by the observation device 112 may also be referred to as a spread image hereinafter.

The imprint apparatus IMP can include a dispenser 108 for arranging (supplying) the imprint material IM on a shot region of the substrate S. The dispenser 108 discharges the imprint material IM so that the imprint material IM will be arranged on the shot region of the substrate S in accordance with, for example, a drop recipe which indicates the arrangement of the imprint material IM. The imprint apparatus IMP can also include the controller 110 for controlling the substrate driving mechanism 105, the mold driving mechanism 122, the deformation mechanism 123, the mold conveyance mechanism 140, the mold cleaner 150, the alignment measuring device 106, the curing device 107, the observation device 112, the dispenser 108, and the like. The controller 110 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer embedded with a program 113 or a combination of all or some of these components.

Figure 3:
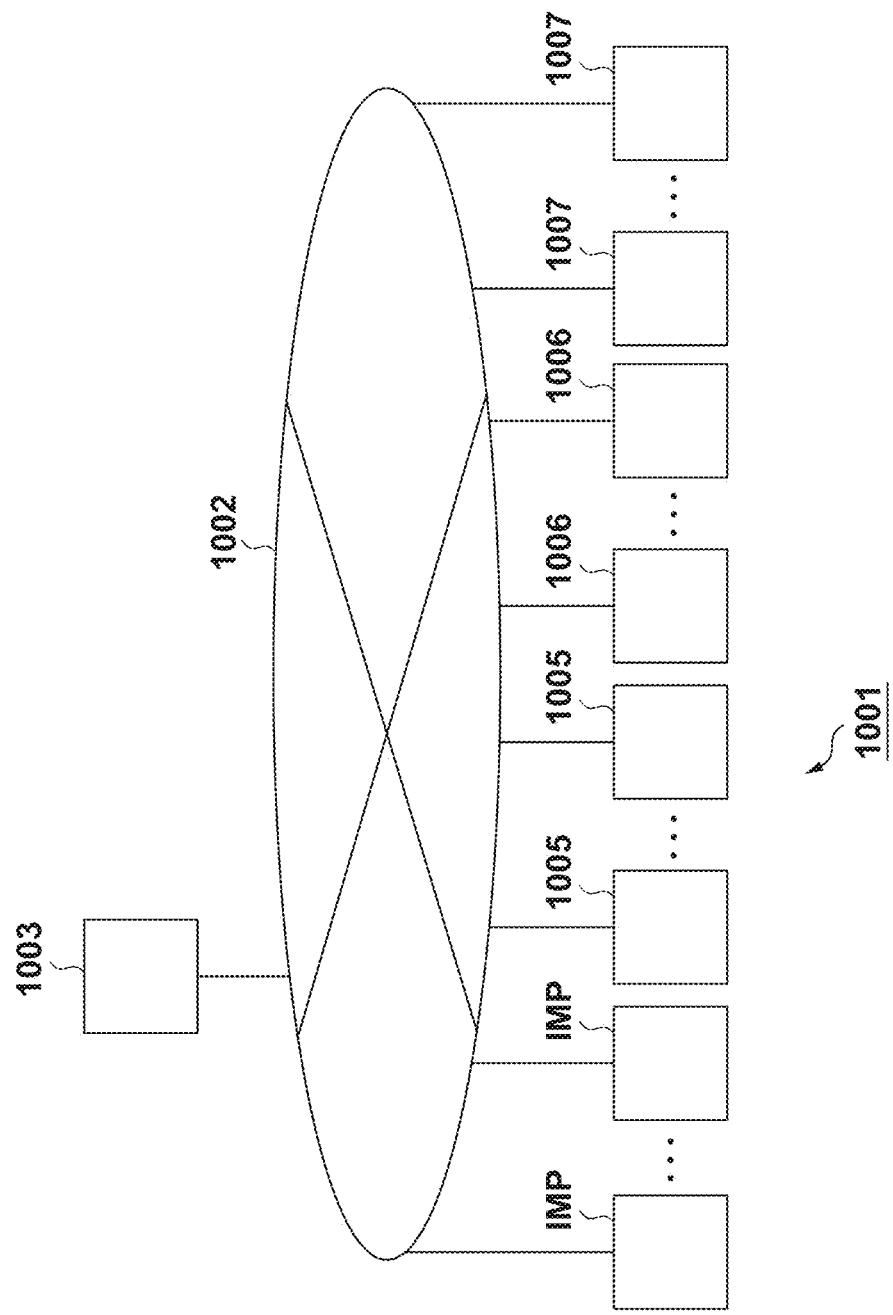
FIG. 3 is a block diagram showing an example of the arrangement of an article manufacturing system.

FIG. 3 shows an example of the arrangement of an article manufacturing system 1001 for manufacturing an article such as a semiconductor device or the like. The article manufacturing system 1001 can include, for example, one or a plurality of lithography apparatuses (the imprint apparatus IMP and/or an exposure apparatus). The imprint apparatus IMP is exemplified as a lithography apparatus in FIG. 3. The article manufacturing system 1001 can also include one or a plurality of inspection apparatuses 1005 (for example, an overlay inspection apparatus and/or a foreign substance inspection apparatus), and one or a plurality of post-processing apparatuses 1006 (an etching apparatus and/or a deposition apparatus). Furthermore, the article manufacturing system 1001 can include one or a plurality of model generation apparatuses (machine learning controllers) 1007 for generating a machine learning model for calculating an alignment error amount and a machine learning model for determining the confidence. These apparatuses can be connected to a control apparatus 1003, as an external system, via a network 1002, and be controlled by the control apparatus 1003. An MES, an EEC, or the like is an example of the control apparatus 1003. Each model generation apparatus 1007 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer embedded with a program or a combination of all or some of these components. Each model generation apparatus 1007 can be, for example, a server called an edge server or the like. The model generation apparatus 1007 may also be incorporated in the control apparatus 1003 or the controller 110 of each lithography apparatus. The system including lithography apparatuses such as the imprint apparatus IMP, the exposure apparatus, and the like and the model generation apparatus 1007 can be understood to be a lithography system.

The alignment measuring device 106 and the controller (processor) 110 of the imprint apparatus IMP can form a measurement apparatus for measuring or detecting the position information of a measurement target. In another point of view, the imprint apparatus IMP includes a measurement apparatus for measuring or detecting the position information of a measurement target. The measurement apparatus can operate as a measurement apparatus that measures or detects the position information of a measurement target in a diffraction direction of a diffraction grating forming each alignment mark, that is, a first direction as a measurement direction. Furthermore, the measurement apparatus can be formed to measure the position information of the measurement target in a direction different from the first direction as the measurement direction, that is, a second direction (for example, a direction perpendicular to the first direction) as a non-measurement direction. The controller 110 can use provisional position information of the measurement target in the first direction that is obtained from image data, and a correction value that is based on a feature quantity of image data related to the second direction, which is different from the first direction, to determine the position information of the measurement target in the first direction. The second direction can be a direction perpendicular to the first direction. The measurement apparatus can use a model for obtaining a correction value based on a feature quantity to determine the correction value. In addition, the measurement apparatus can further include a machine learning controller (model generation apparatus 1007) that generates the model by machine learning.

A lithography method according to this embodiment will be described hereinafter. This lithography method can include a measurement method for measuring (generating) the position information of a measurement target, a measurement method for measuring an alignment error between a shot region of a substrate and an original (mold), and an alignment method for aligning the shot region of the substrate and the original (mold).

This lithography method will estimate, from the image data of a measurement target, a correction value or an alignment error amount as a correction amount. The measurement target here can be (an optical image of) a mark or an optical image (for example, moiré fringes) formed by the first mark and the second mark. An alignment error amount can be an error amount (estimated error amount) estimated to be included in the position information of a mark calculated (generated) based on the image data of the measurement target or an error amount (estimated error amount) estimated to be included in the relative position information between the first mark and the second mark. Note that an error amount may also include, in addition to information related to the size of an error estimated to be included in the position information of the measurement target, information related to the direction of the error.

FIG. 1 shows, as a lithography method according to an embodiment, a lithography method to be executed in a lithography system including the imprint apparatus IMP. The controller 110 can control the operation shown in FIG. 1.

In step S101, a substrate conveyance mechanism (not shown) will convey the substrate S from a conveyance source (for example, a relay portion between a preprocessing apparatus and the imprint apparatus IMP) to the substrate holder 102.

In steps S102 to S106, an imprint process (pattern formation) is executed on a shot region selected from a plurality of shot regions of the substrate S. A shot region selected from the plurality of shot regions of the substrate S may be referred to as a target shot region hereinafter.

First, in step S102, the dispenser 108 arranges the imprint material IM on the target shot region of the substrate S. This process can be performed by, for example, causing the dispenser 108 to discharge the imprint material IM while driving the substrate S by a substrate driving mechanism 105. Next, in step S103, the substrate S and a mold M are driven relatively by at least one of the substrate driving mechanism 105 and a mold driving mechanism 122 so that a pattern region MP of the mold M will contact the imprint material IM on the target shot region. In one example, the mold driving mechanism 122 will drive the mold M so that the pattern region MP of the mold M will contact the imprint material IM on the target shot region. In the process of bringing the pattern region MP of the mold M into contact with the imprint material IM, the deformation mechanism 123 can deform the pattern region MP of the mold M into a convex shape toward the substrate S. At this time, a cavity pressure can be controlled and its value can be accumulated. In addition, the observation device 112 will execute image capturing in the process of bringing the pattern region MP of the mold M into contact with the imprint material IM, and a captured image (spread image) can be accumulated.

In step S104, the alignment of the target shot region of the substrate S and the pattern region MP of the mold M can be performed. The alignment can be performed based on, for example, the relative position information between the first mark of the shot region and the second mark of the mold M, which are obtained by using the alignment measuring device 106, so that the relative position between the first mark and the second mark will fall within a tolerance range of a target relative position. In the alignment, the substrate S and the mold M can be driven relatively by at least one of the substrate driving mechanism 105 and the mold driving mechanism 122. Here, the relative position information of the substrate S and the mold M is obtained by correcting the provisional position information (provisional relative-position information) based on an alignment error amount (correction value), and can be used to determine the target value of the relative driving amounts of each of the substrate S and the mold M. The provisional position information (provisional relative-position information) is information determined based on image data obtained by using the alignment measuring device 106, and can indicate the provisional relative position between the shot region of the substrate S and the mold M. The alignment error amount can be calculated based on the image data obtained by using the alignment measuring device 106. The alignment error amount can be calculated by using a model generated by the model generation apparatus 1007 and provided to the controller 110 of the imprint apparatus IMP. The correction of the relative position information (provisional relative-position information) based on the alignment error amount (correction value) may be executed throughout the entire execution period of the alignment or may be executed at or after a point of time when the relative position between the shot region and the mold M has become equal to or less than a reference value. The controller 110 can accumulate the image data obtained by using the alignment measuring device 106 and provide the accumulated image data to the model generation apparatus 1007 (machine learning controller). The model generation apparatus 1007 can generate, based on the image data provided from the controller 110 of the imprint apparatus IMP, a model for determining the alignment error amount.

Figure 6A:
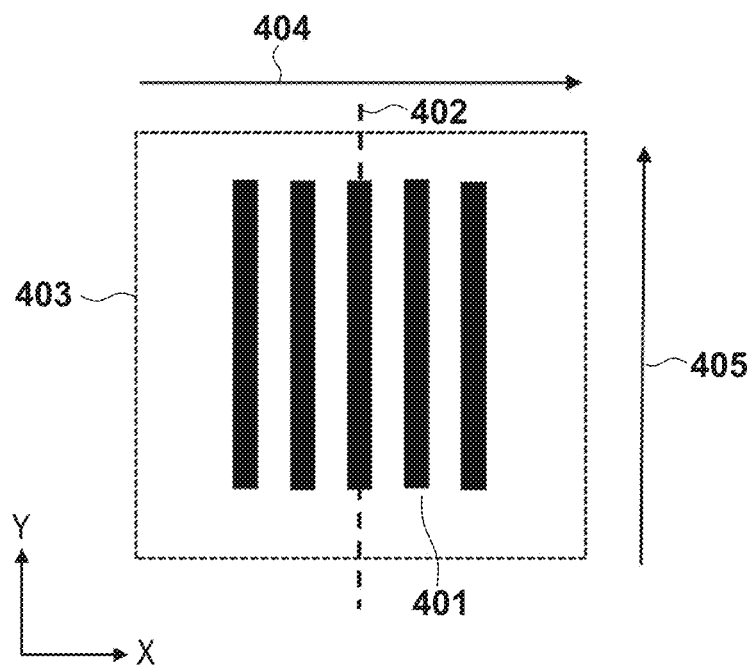
FIG. 6A is a view showing an example of image data of a mark.
Figure 6B:
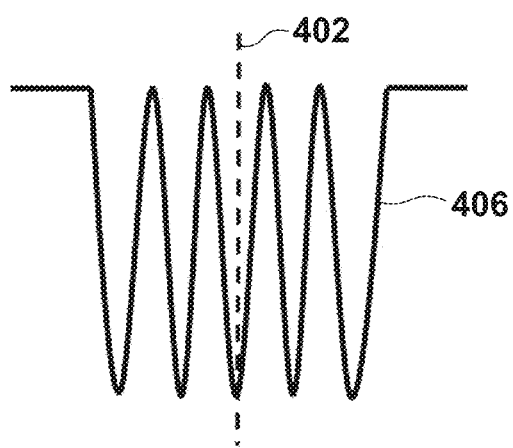
FIG. 6B is a view showing an example of an alignment waveform (signal waveform) obtained from the image data.

A method for measuring the position of a mark will be exemplified here. FIG. 6A shows an example of a mark image (image data) 401 obtained by capturing an image of a mark for measuring a position in the X direction, and FIG. 6B shows an example of an alignment waveform 406 obtained from the mark image 401. The substrate S can include a mark corresponding to the mark image of FIG. 6A and a mark obtained by rotating the mark by 90°. The mark corresponding to the mark image of FIG. 6A is a mark (to be also referred to as an X-direction measurement mark hereinafter) used for measuring a position in the X direction, and the measurement direction is the X direction. The mark obtained by rotating the mark corresponding to the mark image of FIG. 6A by 90° is a mark (to be also referred to as a Y-direction measurement mark hereinafter) used for measuring a position in the Y direction, and the measurement direction is the Y direction.

For example, the controller 110 will use a first mark for measuring the position in the X direction provided on the shot region of the substrate S and a first mark of measuring the position in the Y direction provided on the shot region of the substrate S to obtain, as the provisional position information, a position in the X direction and a position in the Y direction of the shot region. In a similar manner, a position in the X direction and a position in the Y direction of the mold M will be obtained as the provisional position information by using a second mark for measuring the position in the X direction provided on the mold M and a second mark for measuring the position in the Y direction provided on the mold M. Subsequently, the controller 110 can correct these pieces of provisional position information based on the alignment error amount (correction value) to generate the relative position information (alignment error) of the shot region of the substrate S and the mold M.

Alternatively, the controller 110 will obtain, as provisional relative-position information, a relative position between the shot region and the mold M in the X direction from moiré fringes formed by the first mark for measuring a position in the X direction provided on the shot region of the substrate S and the second mark for measuring a position in the X direction provided on the mold M. In a similar manner, a relative position between the shot region and the mold M in the Y direction will be obtained as provisional relative-position information from moiré fringes formed by the first mark for measuring a position in the Y direction provided on the shot region of the substrate S and the second mark for measuring a position in the Y direction provided on the mold M. Subsequently, the controller 110 can correct these pieces of provisional position information based on the alignment error amount (correction value) to generate the relative position information (alignment error) between the shot region of the substrate S and the mold M.

Figure 7:
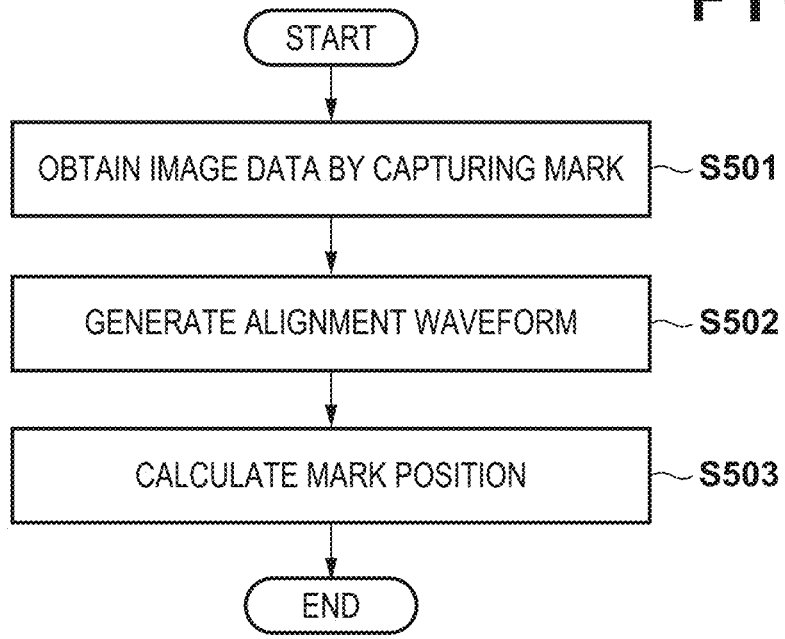
FIG. 7 is a flowchart showing an example of a method of obtaining a position (provisional position information) of the mark.

FIG. 7 shows a method in which the alignment measuring device 106 is used to obtain the position of a mark as the provisional position information. A method for obtaining a mark position 402 as the provisional position information will be described hereinafter by using the mark image of FIG. 6A as an example. As one example, the mark position 402 to be measured is a center position of the mark image in the measurement direction (the X direction in FIG. 6A), and this is also the center position of the mark corresponding to this mark image. In this example, assume that a measurement direction 404 is the X direction and a non-measurement direction 405 is the Y direction.

In step S501, the controller 110 obtains the mark image 401 (image data) by using the alignment measuring device 106 to capture an image of the mark. In step S502, the controller 110 generates (calculates) the alignment waveform 406 based on the mark image 401. The alignment waveform 406 is a signal waveform in the measurement direction (X direction) that can be obtained from the mark image 401. The alignment waveform 406 can be generated by, for example, calculating an integrated value of pixels whose positions in the measurement direction 404 (X direction) are equal to each other, among a plurality of pixels which form a measurement region 403 including the mark image 401.

In step S503, the controller 110 calculates, based on the alignment waveform 406, the mark position 402 as the provisional position information. As an example of the calculation method, there is a method of setting the position of the center of gravity of the alignment waveform 406 as the mark position 402. As another example, there is a method of calculating the mark position by calculating the phase of the alignment waveform by Fourier transform or the like or a method of calculating the mark position by using a pattern matching method.

Returning the description to FIG. 1, in step S105, the curing device 107 will irradiate the imprint material IM, which is between the substrate S and the pattern region MP of the mold M, with energy for curing the imprint material IM. This will cure the imprint material IM and form a cured product of the imprint material IM. In step S106, the substrate S and the mold M are relatively driven by at least one of the substrate driving mechanism 105 and the mold driving mechanism 122 so that the cured product of the imprint material IM and the pattern region MP of the mold M will be separated from each other. In one example, the mold M is driven by the mold driving mechanism 122 so as to separate the pattern region MP of the mold M from the cured product of the imprint material IM. The pattern region MP of the mold M can be deformed in a convex shape toward the substrate S also when the cured product of the imprint material IM and the pattern region MP of the mold M are to be separated from each other. In addition, the observation device 112 will execute image capturing, and the state of separation between the imprint material IM and the mold M can be observed based on the captured image.

In step S107, the controller 110 determines whether the processes of the imprint process from step S102 to step S106 have been performed on all of the shot regions of the substrate S. If it is determined that the processes of the imprint process from step S102 to step S106 have been performed on all of the shot regions of the substrate S, the controller 110 will advance the process to step S108. If it is determined that an unprocessed shot region is present, the process returns to step S102. In this case, a shot region selected from the unprocessed shot regions will be set as a target shot region, and the processes of the imprint process from step S102 to step S106 will be executed on the target shot region.

In step S108, the substrate conveyance mechanism (not shown) will convey the substrate S from the substrate holder 102 to a conveyance destination (for example, a relay portion to a post-processing apparatus). In a case in which a lot formed by a plurality of substrates is to be processed, the operation shown in FIG. 1 will be executed on each of the plurality of substrates.

Here, in the imprint apparatus IMP (lithography apparatus), a mark (abnormal mark) which is not formed in the actually intended shape or position may be present among the marks provided on the substrate S and/or the mold M. If the position information of such an abnormal mark is directly used, it may be difficult to accurately align the substrate S and the mold M. Hence, the imprint apparatus IMP (controller 110) according to this embodiment can determine, as a material for making a determination to allow appropriate use of the position information of a measurement target (for example, a mark) obtained from image data (mark image), the confidence of the position information.

More specifically, the controller 110 of the imprint apparatus IMP can be configured to function as a processing apparatus that includes a generator for generating position information of a measurement target and a determinator for determining the confidence of the position information. The generator can generate, based on the image data of a measurement target generated by image capturing by the alignment measuring device 106, the position information of the measurement target in a first direction (measurement direction). The generator may generate (determine), based on the correction value and the provisional position information of the measurement target, the position information of the measurement target in the first direction as described above. The determinator can determine, based on each feature quantity of the image data related to a second direction (non-measurement direction) different from the first direction, the confidence of the position information of the measurement target generated by the generator. The confidence is an index (information) expressing the degree to which the position information of the measurement target generated by the generator can be believed to be normal, and may be understood to be a degree of certainty and/or reliability.

The controller 110 (determinator) that functions as the processing apparatus described above can use a model for obtaining the confidence of the position information in the first direction based on a feature quantity in the second direction of the image data to determine the confidence from the feature quantity. The controller 110 may also include a machine learning controller (model generation apparatus 1007) that generates the model by machine learning. In addition, the above-described function as the processing apparatus may also be incorporated in the control apparatus 1003 instead of or in addition to the controller 110 of the imprint apparatus IMP.

Figure 4:
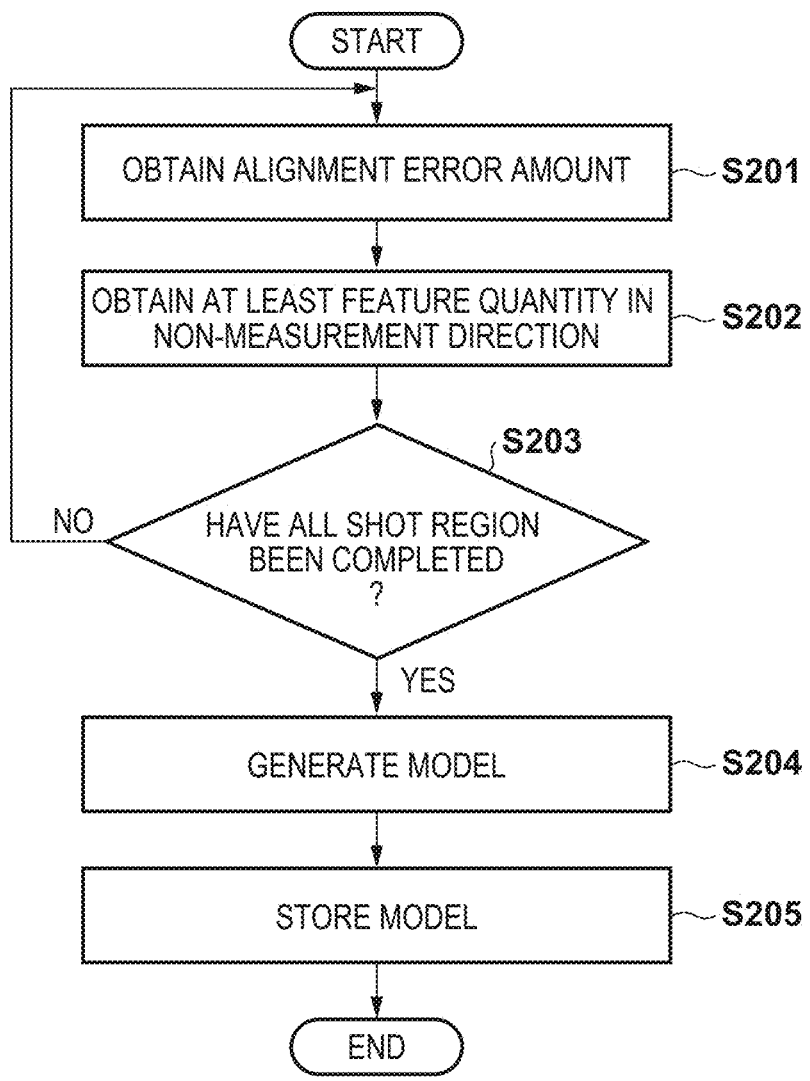
FIG. 4 is a flowchart showing an example of a model generation method.

The model generation method of the model generation apparatus 1007 will be described next with reference to FIG. 4. Note that the model generation apparatus 1007 may be incorporated in the imprint apparatus IMP (for example, the controller 110) as described above, and model generation will be performed in the imprint apparatus IMP in such a case.

In step S201, the model generation apparatus 1007 will obtain an alignment error amount. More specifically, the model generation apparatus 1007 will obtain a measurement value of one shot region of the substrate S measured by an overlay inspection apparatus (inspection apparatus 1005). The measurement value to be obtained can be a result obtained by measuring the overlay accuracy of at least one point belonging to each shot region of the substrate S. The measurement value can be, for example, an overlay shift amount obtained between (an overlay inspection mark of) an underlayer of the substrate S and (an overlay inspection mark of) a layer formed above this underlayer by the imprint apparatus IMP. The model generation apparatus 1007 will calculate, as the alignment error amount, a difference between the measurement value obtained by the overlay inspection apparatus and a final measurement value (for example, the position information (alignment error) ultimately obtained in step S104) obtained by the imprint apparatus IMP.

In step S202, the model generation apparatus 1007 will obtain at least a feature quantity of a mark image in the non-measurement direction. More specifically, the model generation apparatus 1007 will first obtain a mark image (image data) of the mark of the shot region from which the measurement value was obtained in the immediately preceding step S201. This mark image is a mark image obtained by using the alignment measuring device 106 in step S104, and can be provided from the imprint apparatus IMP to the model generation apparatus 1007 at an arbitrary timing after the completion of step S104. Subsequently, the model generation apparatus 1007 will further obtain a feature quantity of the obtained mark image. This feature quantity includes at least a feature quantity related to the non-measurement direction, and may additionally include a feature quantity related to the measurement direction. The measurement direction is the X direction in FIGS. 6A and 6B. The non-measurement direction is a direction intersecting the X direction and is, for example, the Y direction in FIGS. 6A and 6B.

In step S203, the model generation apparatus 1007 determines whether the processes of steps S201 and S202 were executed for all of the plurality of shot regions considered to be targets of the substrate S. If a shot region that has not undergone the processes is present, the process is returned to step S201, and the processes of steps S201 and S202 are performed on this shot region. Subsequently, when the processes of steps S201 and S202 have been executed on all of the plurality of shot regions considered to be targets, the process will advance to step S204. In step S204, the model generation apparatus 1007 will generate a model for estimating an alignment error amount based on a feature quantity and a model for determining confidence based on a feature quantity.

Depending on the cause of the positional shift between the measurement value obtained by the overlay inspection apparatus and the measurement value obtained by the imprint apparatus IMP, it may be possible to reduce the alignment error amount more by generating a model by using a feature quantity related to the non-measurement direction and a feature quantity related to the measurement direction. In such a case, it is preferable to generate a model that has been trained by using both the feature quantity related to the non-measurement direction and the feature quantity related to the measurement direction.

The model (error amount estimation model) for estimating an alignment error amount based on a feature quantity can be formed here to set a feature quantity as an input and output information indicating the alignment error amount. The error amount estimation model may be formed to output the alignment error amount itself as the information indicating the alignment error amount or may be formed to output a value and/or a distribution including an index indicating the alignment error amount. In addition, the model (confidence determination model) for determining the confidence based on a feature quantity can be formed to use a feature quantity as an input and output information indicating the confidence. The confidence determination model may be formed to output the confidence itself as the information indicating the confidence or may be formed to output a value and/or a distribution including an index indicating the confidence. This embodiment will describe an example in which a model that uses a feature quantity as an input and outputs a distribution which includes an index indicating an alignment error amount and an index indicating the confidence is generated.

Model generation can be performed by, for example, machine learning. A more specific example can be raised as follows. First, a new layer (pattern) is formed on each of a plurality of shot regions under the same condition by the imprint apparatus IMP. Next, an external overlay inspection apparatus measures an overlay shift amount between (an overlay inspection mark of) an underlying layer and (an overlay inspection mark of) a newly formed layer of each shot region. Subsequently, the model generation apparatus 1007 obtains the measured overlay shift amount of each shot region and calculates, as the alignment error amount, the difference between the overlay shift amount of each shot region and the final measurement value obtained when a layer is newly formed on the shot region. Thereafter, the model generation apparatus 1007 will perform machine learning by using, as input data of the model, the feature quantity of the mark image of each shot region used when newly forming a layer, and using the calculated alignment error amount as the training data.

Preprocessing may be performed on the alignment error amount when machine learning is to be performed. Examples of preprocessing are, for example, a method for adding an offset value to the alignment error amount and a method of changing the scale of error amount by multiplying the alignment error amount by a value.

For example, Gaussian process regression and Bayesian inference in which inference with consideration to uncertainty is performed by using a variable as a probability can be raised as examples of methods of machine learning. In a case in which Gaussian process regression and Bayesian inference are to be used, the model can be a function that will output a probability distribution of the alignment error amount by inputting a feature quantity, and the optimization of an internal variable can be performed by machine learning. An expected value of the obtained probability distribution of the error amount can be used as an inference value of the error amount, and a variance of the probability distribution can be used as the confidence.

In a case in which the computational complexity of the inference needs to be reduced, it is suitable to use a statistical model with a low computational complexity such as a multiple regression analysis or the like. In a case in which the alignment error amount is to be calculated by using a high dimensional feature quantity such as by setting each pixel value of a mark image as a feature quantity, it is suitable to use a method that optimizes an internal variable by using a neural network formed by a multilayer perceptron. In a case in which many abnormal values are included in the alignment error amount or the mark image, a method based on a decision tree analysis which is robust to abnormal value may be used. In a case in which a multiple regression analysis or a neural network is to be used, a model can be defined to output an alignment error amount when a feature quantity is input, and optimization of an internal variable can be performed by machine learning. In a case in which a decision tree analysis is to be used, a model can be defined to output an alignment error amount when a feature quantity is input, and a decision tree can be constructed by machine learning.

In step S205, the model generation apparatus 1007 will store the model generated in step S204. In addition, the model generation apparatus 1007 can also provide the model generated in step S204 to the controller 110 of the imprint apparatus IMP.

Figure 14A:
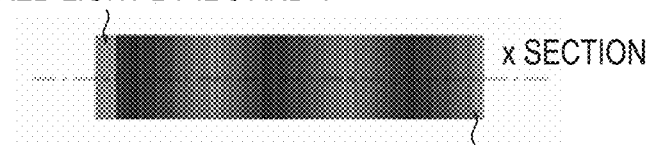

The reason why (the principle of) the feature quantity of a mark image in the non-measurement direction is used in the estimation of an alignment error amount and the determination of the confidence will be described here. FIG. 14D shows the principle of measuring the relative position information between the shot region of the substrate S and the mold M based on the moiré fringes as an optical image formed by the first mark provided on the shot region of the substrate S and the second mark provided on the mold M. FIG. 14D shows a first mark 3a provided on the shot region of the substrate S and a second mark 2a provided on the mold M. The alignment measuring device 106 includes an illumination optical system that illuminates these marks, and the illumination optical system has a pupil plane P. Reference symbols IL1, IL2, IL3, and IL4 indicate rays of illumination light from poles formed on the pupil plane P.

Figure 14B:
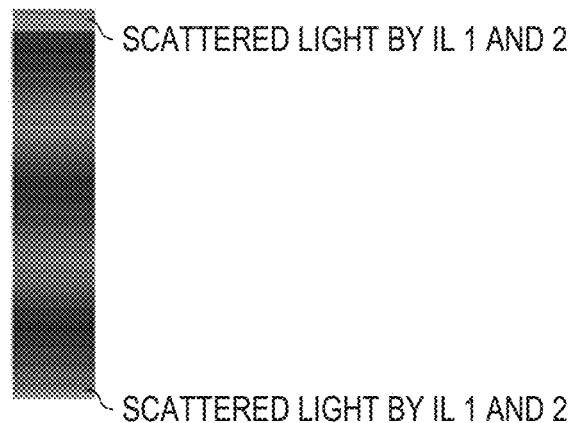
Figure 14C:
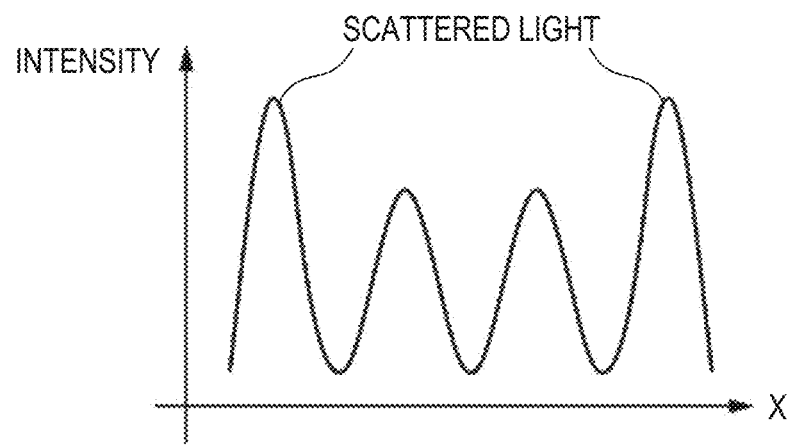

The illumination light IL1 and the illumination light IL2 are used for the measurement of a relative position between the shot region of the substrate S and the mold M in the X direction. As exemplified in FIG. 14A, in the measurement of the relative position in the X direction, the illumination light IL3 and the illumination light IL4 which are not used in the measurement of the relative position in the X direction can become rays of scattered light by being scattered by the edges of the first mark 3a and the second mark 2a. Each ray of scattered light can become a flare and mix into a moiré fringe signal (moiré fringe image data). FIG. 14C shows an example of a signal intensity distribution (light intensity distribution on a light receiving surface of an image capturing element of the alignment measuring device 106) of the moiré fringe signal in the X direction in FIG. 14A. It can be seen that there are large peaks on the left end side and the right end side of the signal intensity distribution due to the influence of the rays of light scattered by the edges of the first mark 3a and the second mark 2a. Among the four cycles of the moiré fringe signal, the two cycles on the left end side and the right end side have received the influence of the scattered light, and the measurement accuracy of the relative position is influenced as a result. As shown in FIG. 14B, a similar phenomenon also occurs in the measurement of a relative position in the Y direction, and the illumination light IL1 and the illumination light IL2 which are not used in the measurement of the relative position in the Y direction can become rays of scattered light by being scattered by the edges of a first mark 3b and a second mark 2b. As a result, each ray of scattered light can become flare light and mix into the moiré fringe signal. Although the influence of flare light on the light intensity distribution in each measurement direction has been described above, the light intensity distribution in each non-measurement direction can also change due to receiving an influence from flare light based on the same principle. A change in the light distribution in the non-measurement direction can also degrade the measurement accuracy of a relative position or a position in the measurement direction.

Figure 15:
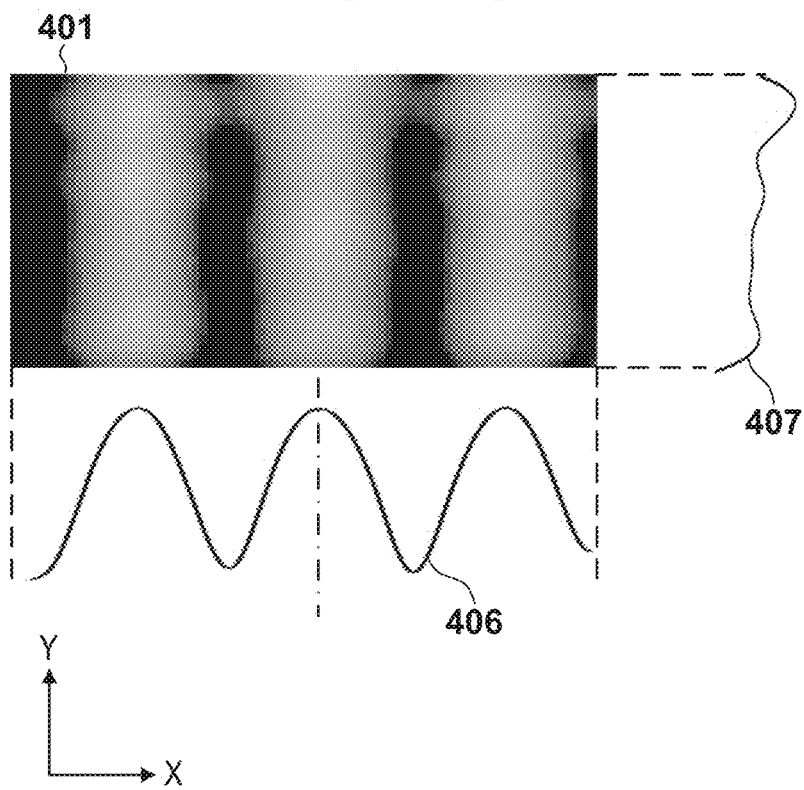
FIG. 15 is a view showing an example of signal waveforms (in the measurement direction and in the non-measurement direction) obtained from the image data of an alignment mark.
Figure 16:
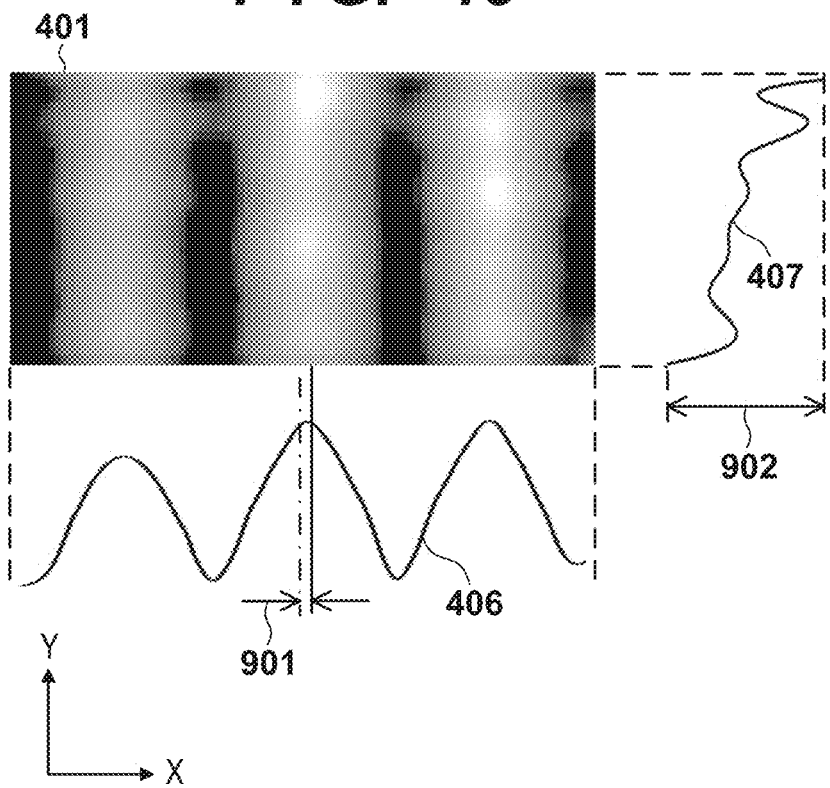
FIG. 16 is a view showing an example of the signal waveforms (in the measurement direction and in the non-measurement direction) obtained from the image data of the alignment mark.

FIGS. 15 and 16 each show an example of the signal waveform 406 in the measurement direction (X direction) and a signal waveform 407 in the non-measurement direction (Y direction). The signal waveform 406 in the measurement direction is also called an alignment waveform and is obtained by calculating an integrated value of signal values of pixels whose positions in the measurement direction are equal to each other, among the plurality of pixels forming the mark image 401 obtained by using the alignment measuring device 106. In addition, the signal waveform in the non-measurement direction can be obtained by calculating an integrated value of signal values of pixels whose positions in the non-measurement direction are equal to each other, among the plurality of pixels forming the mark image 401 obtained by using the alignment measuring device 106.

The influence of a flare is greater in the example shown in FIG. 16 than that in the example shown in FIG. 15. Since the distortion of the signal waveform 406 in the measurement direction in the example shown in FIG. 16 is larger than the distortion of the signal waveform 406 in the measurement direction in the example shown in FIG. 15, an error 901 can occur in the measurement result obtained in the measurement direction. Also, the distortion of the signal waveform 407 in the non-measurement direction in the example shown in FIG. 16 is larger than the distortion of the signal waveform 407 in the non-measurement direction in the example shown in FIG. 15, thus indicating a large variation 902 of the signal value. That is, it can be seen that the signal waveform 407 in the non-measurement direction is correlated to the signal waveform 406 in the measurement direction, that is, the measurement result obtained in the measurement direction. Hence, the position information of a measurement target can be accurately determined by obtaining a feature quantity of image data related to the non-measurement direction and correcting, based on the feature quantity, the provisional position information of the measurement target in the measurement direction obtained from the image data. In addition, based on the above description, it can be said that a feature quantity of image data related to the non-measurement direction reflects the distortion of the signal waveform and/or the variation of the signal value in the measurement direction. Hence, the confidence (the degree of certainty or reliability) of the position information of the measurement target determined from the image data can be determined based on the feature quantity.

Figure 8:
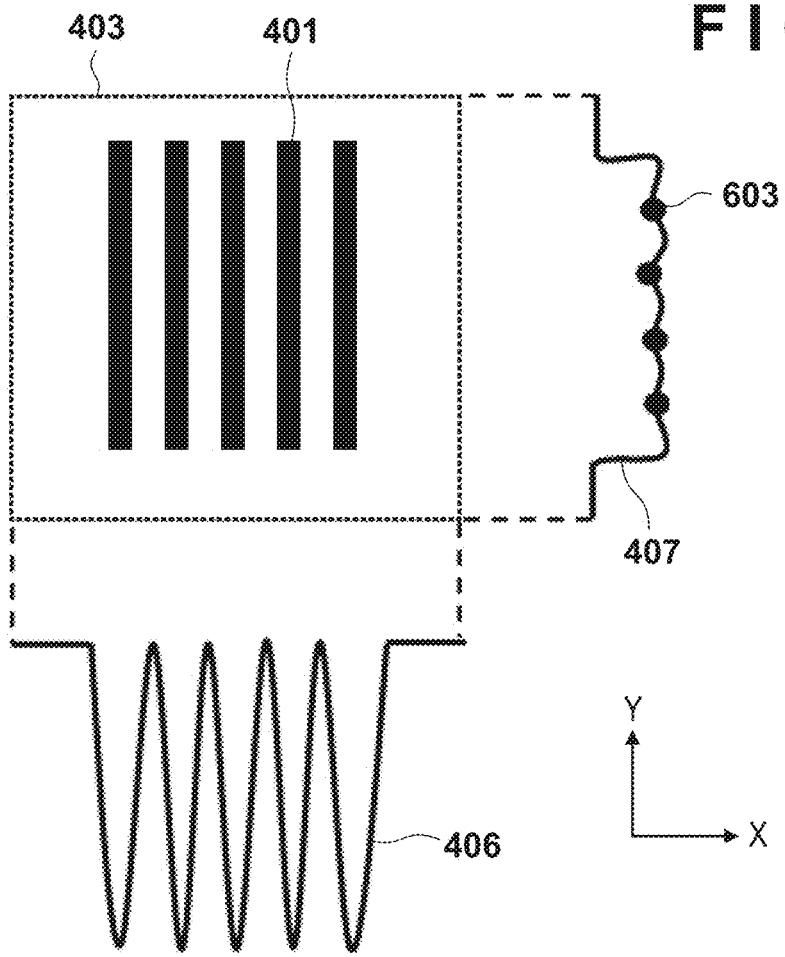
FIG. 8 is a view showing an example of a method of obtaining a feature quantity related to a non-measurement direction from the image data of the mark.

The feature quantity which can be obtained from the image data in relation to the non-measurement direction (second direction) will be described here with reference to FIG. 8. In a similar manner to FIGS. 6A and 6B, FIG. 8 shows an example of the mark image (image data) 401 obtained by capturing an image of a mark for measuring a position in the X direction and the signal waveform 406 (the signal waveform in the measurement direction (X direction)) obtained from the mark image 401. In addition, FIG. 8 also shows an example of the signal waveform 407 in the non-measurement direction (Y direction) obtained from the mark image 401. The signal waveform 407 in the non-measurement direction can be generated by, for example, calculating an integrated value of the pixels whose positions in the non-measurement direction (Y direction) are equal to each other, among the plurality of pixels which form the measurement region 403 including the mark image 401.

A feature quantity obtained from the image data with respect to the non-measurement direction (second direction) can include a plurality of values 603 corresponding to a plurality of positions in the non-measurement direction as exemplified in FIG. 8. The plurality of values 603 include a plurality of integrated values, and each of the plurality of integrated values can be an integrated value of signal values of pixels whose positions in the non-measurement direction are equal to each other, among the plurality of pixels forming the image data. Alternatively, the plurality of values 603 can include the signal values of a plurality of pixels on a line parallel to the non-measurement direction, among the plurality of pixels forming the image data. Alternatively, the plurality of values 603 can be a plurality of values obtained by processing signal values of a plurality of pixels on a line parallel to the non-measurement direction, among the plurality of pixels forming the image data. Alternatively, the plurality of values 603 can be obtained by performing basis transformation on a plurality of integrated values, and each of the plurality of integrated values can be an integrated value of signal values of pixels whose positions in the non-measurement direction are equal to each other, among the plurality of pixels forming the image data. Alternatively, the plurality of values 603 can be values obtained by performing basis transformation on the signal values of a plurality of pixels which are on a line parallel to the non-measurement direction, among the plurality of pixels forming the image data. Alternatively, the plurality of values 603 can be values obtained by performing basis transformation on a plurality of values obtained by processing the signal values of a plurality of pixels which are on a line parallel to the non-measurement direction, among the plurality of pixels forming the image data.

Figure 9:
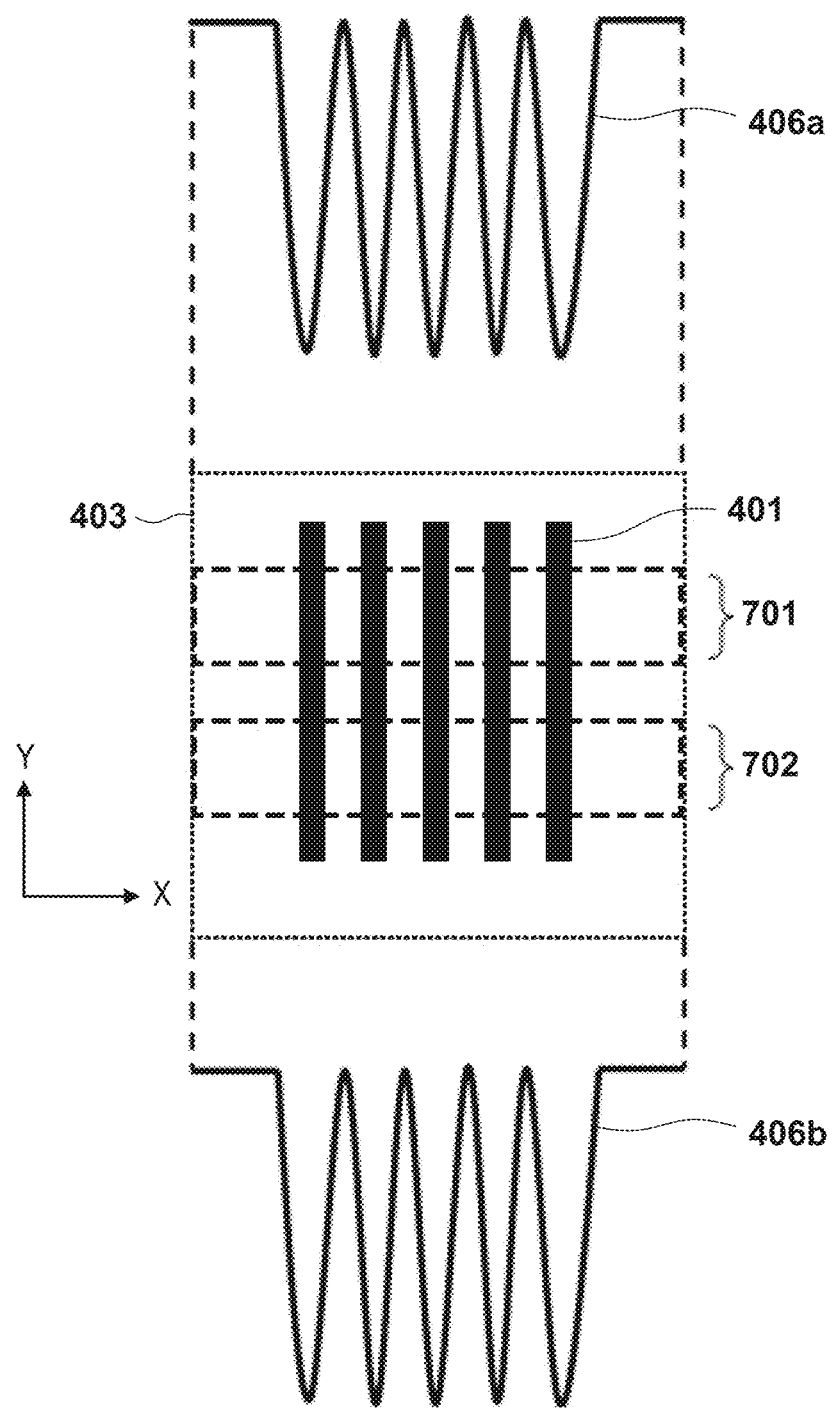
FIG. 9 is a view showing an example of the method of obtaining the feature quantity related to the non-measurement direction from the image data of the mark.

Alternatively, as shown in FIG. 9, a difference between a result obtained by integrating the signal values of pixels whose positions in the measurement direction are equal to each other in a partial region 701, and a result obtained by integrating the signal values of pixels whose positions in the measurement direction are equal to other in a partial region 702 may be set as a feature quantity in the non-measurement direction. More specifically, a difference between an alignment waveform 406a in the measurement direction (X direction) obtained from the partial region 701 and an alignment waveform 406b in the measurement direction (X direction) obtained from the partial region 702 may be set as the feature quantity in the non-measurement direction. The partial region 701 and the partial region 702 are regions whose positions in the non-measurement direction (Y direction) are different from each other in the measurement region 403 including the mark image 401.

Figure 10:
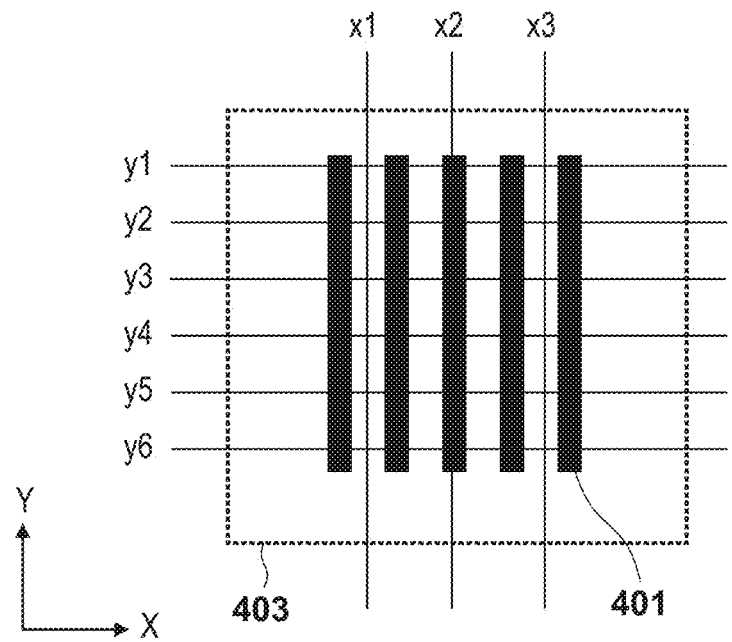
FIG. 10 is a view showing an example of the method of obtaining the feature quantity related to the non-measurement direction from the image data of the mark.

An example of calculating or determining a feature quantity of image data in the non-measurement direction will be described below with reference to FIG. 10. In FIG. 10, reference symbols x1, x2, . . . represent X-coordinate values (pixel positions in the X direction) of the image data (mark image 401) obtained by image capturing by the alignment measuring device 106. In addition, reference symbols y1, y2, . . . represent Y-coordinate values (pixel positions in the Y-direction) of the image data. A pixel value of a pixel whose X-coordinate value is x1 and Y-coordinate value is y1 will be expressed as x1y1 hereinafter. The interval between and the number of the coordinates x1, x2, . . . , and y1, y2, . . . of pixels to be extracted or sampled can be determined (set) arbitrarily.

In one example, a feature of a signal waveform in the non-measurement direction can be obtained as a feature quantity by integrating the pixel values of pixels, which have y-coordinate values that are equal to each other, in the manner of (x1y1+x2y1+x3y1+ . . . ), (x1y2+x2y2+x3y2+ . . . ), . . . . This kind of method is effective when diffracted light and/or scattered light has been generated along the non-measurement direction.

In a case in which diffracted light or scattered light has been generated locally, (x1y1), (x1y2), (x1y3), (x1y4), (x1y5), (x1y6), (x2y1), (x2y2), . . . which are the pixel values of pixels at respective coordinate positions can be directly used as the feature quantities in the non-measurement direction. Feature quantities may also be determined here as (x1y1+x1y2), (x1y3+x1y4), (x1y5+x1y6), (x2y1+x2y2), (x2y3+x2y4), . . . . By adding the pixel values of the plurality of pixels in the Y direction in this manner, it will be possible to reduce the number of data indicating the feature quantity, thus lowering the computational complexity of the calculation of the correction value based on the feature quantities as a result. In addition, the total value of pixel values of each group formed by a plurality of pixels may be extracted as a feature quantity so as to arrange the average coordinates of each group in an ascending order in the manner of (x1y1+x1y3), (x1y2+x1y4), . . . . Alternatively, the total value of pixel values of each group formed by a plurality of pixels may be extracted as a feature quantity so that coordinates of respective groups will partially overlap each other in the manner of (x1y1+x1y2+x1y3), (x1y3+x1y4+x1y5), . . . . Alternatively, feature quantities may be extracted by performing addition in the X and Y directions in the manner of (x1y1+x1y2+x2y1+x2y2), (x1y2+x1y3+x2y2+x2y3), (x1y3+x1y4+x2y3+x2y4) . . . . In a case in which diffracted light and/or scattered light has been generated along a diagonal direction, feature quantities may be extracted by performing addition in the diagonal direction in the manner of (x1y1+x2y2), (x2y2+x3y3), (x1y2+x2y3), (x2y3+x3y4), . . . .

Alternatively, the pixel values of respective pixels may be multiplied by constants $\alpha$, $\beta$, $\gamma$, . . . in the manner of ($\alpha \times$x1y1), ($\beta \times$x1y2), ($\gamma \times$x1y3) . . . . This can arbitrarily reduce the weight of each feature quantity with a small correction effect. Alternatively, feature quantities may be determined in the manner of ($\alpha \times$x1y1+$\beta \times$x1y2+$\gamma \times$x1y3), (a$\times$x1y2+b$\times$x1y3+c$\times$x1y4), (p$\times$x1y3+q$\times$x1y4+r$\times$x1y5), . . . . Here, $\alpha$, $\beta$, $\gamma$, a, b, c, p, q, and r each are a constant for multiplying a pixel value. Letting $\alpha$=a=p=−1, $\beta$=b=p=2, and $\gamma$=C=r=−1, it will be possible to obtain each gradient in the non-measurement direction as a feature quantity.

A new feature quantity may be obtained by performing basis transformation on a feature quantity obtained in the non-measurement direction. As an example of basis transformation, there are a method of obtaining a phase and an amplitude by performing Fourier transform and a method of contracting an information amount by obtaining a basis based on principal component analysis and performing basis transformation. A new feature quantity may also be obtained by adding an offset value to a feature quantity or by multiplying a feature quantity by an offset value. A correction value may be determined by using, in addition to a feature quantity in the non-measurement direction, a feature quantity in the measurement direction. An arbitrary point of a waveform (image data) in the measurement direction may also be sampled and used as a feature quantity, and basis transformation, addition of an offset value, or multiplication by an offset value may be performed on this feature quantity in a manner similar to a feature quantity in the non-measurement direction. Note that the processing for obtaining a feature quantity from the image data can also be executed by the controller 110 or the like of the imprint apparatus IMP.

Figure 5:
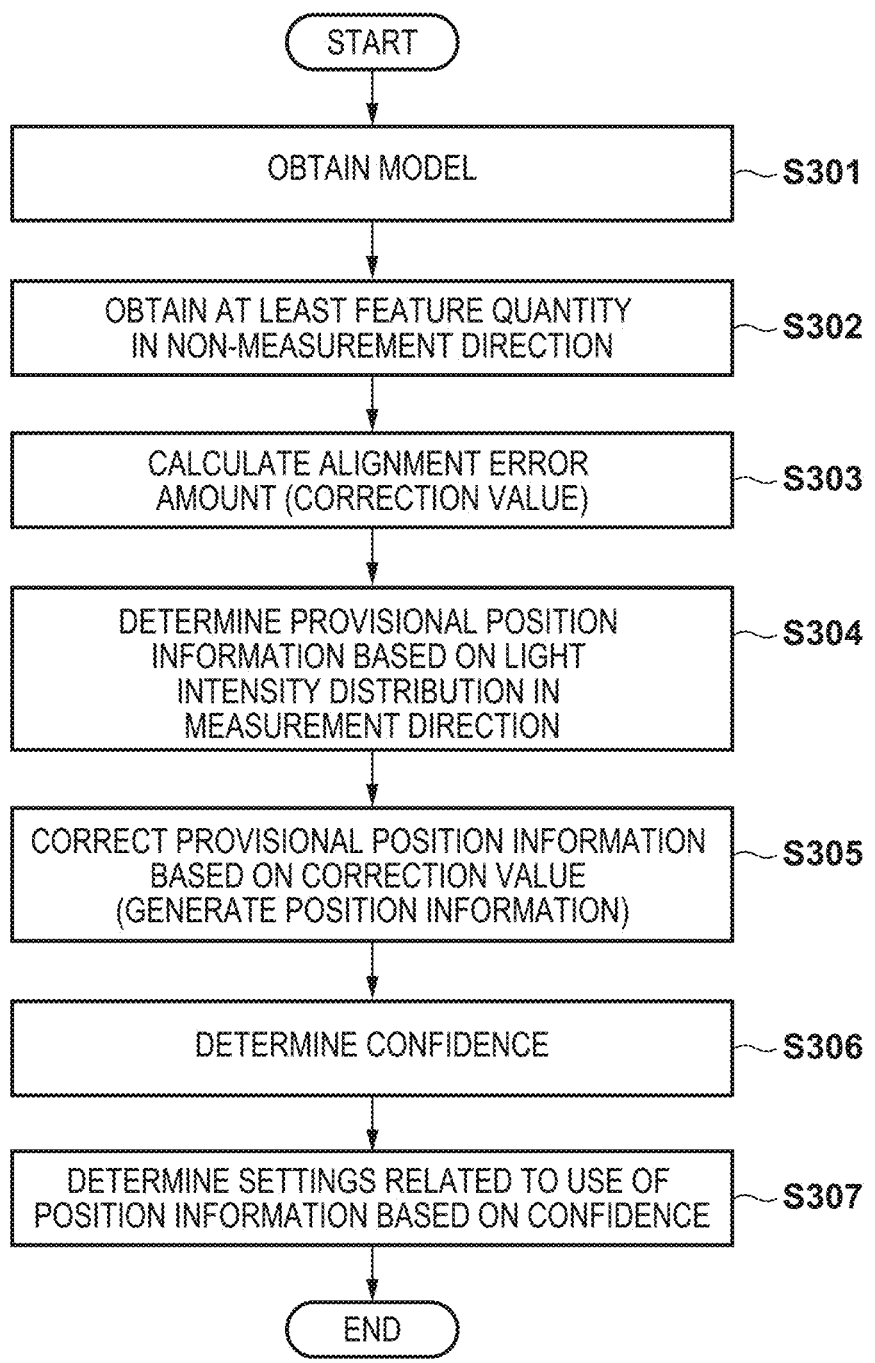
FIG. 5 is a flowchart showing an example of processing executed in an alignment operation.

Processing to be executed in the aforementioned process of step S104 (alignment) will be described next with reference to FIG. 5. In this processing, the position information of a measurement target is generated by using the aforementioned model to calculate an alignment error amount, and correcting, based on this alignment error amount (correction amount), the provisional position information related to the measurement direction obtained based on the image data. In addition, the confidence will be determined by using the aforementioned model, and each setting related to the use of the position information of the measurement target in step S104 (alignment) will be made based on this confidence.

In step S301, the controller 110 of the imprint apparatus IMP obtains a model generated by the model generation apparatus 1007. Note that a model need not be obtained immediately before the process of step S302 as a subsequent process, and may be obtained, for example, at an arbitrary timing such as a timing before the aforementioned process of step S102 or the like.

In step S302, the controller 110 obtains the image data obtained by image capturing by the alignment measuring device 106 in step S104, and obtains (extracts or calculates) at least each feature quantity related to the non-measurement direction from the image data. The method used for calculating or extracting each feature quantity in step S302 is similar to the method for calculating or extracting each feature quantity executed by the model generation apparatus 1007 in step S202.

In step S303, the controller 110 can use the model obtained in step S301 and each feature quantity calculated or extracted in step S302 to calculate an alignment error amount. For example, if Gaussian process regression is to be used as a training means, each feature quantity will be input to the model obtained in step S301, and an expected value of a probability distribution output from the model can be obtained as an alignment error amount. This alignment error amount can be used as a correction value.

In step S304, based on a light intensity distribution related to the measurement direction of the image data obtained image capturing by the alignment measuring device 106 in step S104, the controller 110 determines (obtains) the provisional position information of a measurement target in the measurement direction. This provisional position information is tentative position information of the measurement target which is obtained without consideration to each feature quantity related to the non-measurement direction of the image data.

In step S305, based on the provisional position information obtained in step S304 and the correction value based on each feature quantity of the image data related to the non-measurement direction obtained in step S303, the controller 110 generates the position information of the measurement target in the measurement direction. More specifically, the controller 110 can generate the position information of the measurement target in the measurement direction by subtracting, from the provisional position information obtained in step S304, the correction value which was obtained in step S303 and is based on each feature quantity, of the image data, related to the non-measurement direction.

In a case in which each feature quantity related to the measurement direction is to be used, in addition to each feature quantity related to the non-measurement direction, at the time of model generation, the controller 110 may calculate or extract, in step S302, each feature quantity related to the non-measurement direction and each feature quantity related to the measurement direction. Subsequently, in step S303, the controller 110 may input each feature quantity related to the non-measurement direction and each feature quantity related to the measurement direction into a model and set, as the correction value, an alignment error amount output from the model, and the controller 110 may obtain, in step S305, the position information of the measurement target.

In step S306, the controller 110 uses the model obtained in step S301 and the feature quantity calculated or extracted in step S302 to determine (calculate) the confidence of the position information of the measurement target obtained in step S305. For example, if Gaussian process regression is used as the training means, the feature quantity is input to the model obtained in step S301, and the variance of the probability distribution output from the model can be determined to be the confidence. By determining the confidence of a measurement target (for example, a mark) in this manner, it will be possible to determine, based on the confidence, whether the mark as the measurement target is an abnormal mark. In other words, whether the position information of the measurement target can be used in the alignment performed in step S104 can be determined.

In step S307, the controller 110 sets, based on the feature quantity determined in step S306, settings related to the use (use in the alignment operation of step S104) of the position information of the measurement target generated in step S305. The setting may be a setting to use or not to use, in the alignment performed in step S104, the position information of the measurement target generated in step S305. It may also be the setting of a weight added to the position information when the position information of the measurement target generated in step S305 is to be used in the alignment performed in step S104. These settings can be executed by the controller 110 as a part of the processing apparatus and/or a setting device included in the control apparatus 1003.

An example of the alignment based on the above-described processing will be described here. Assume a case in which control is performed to set the relative position between the substrate S (shot region) and the mold M to a target relative position by using the position information (alignment measurement value) generated by the above-describe processing by setting, as measurement targets, one or more marks (alignment marks) arranged in a target shot region of the substrate S. In this case, target relative position components sx, sy, θx, θy, βx, and βy are obtained so as to minimize an evaluation value V expressed as follows.

$$V = \frac{1}{n}\sum_{i=1}^{n}\left\|\begin{bmatrix}dx_i\\dy_i\end{bmatrix} - \begin{bmatrix}\beta_x & -\theta_y\\\theta_x & \beta_y\end{bmatrix}\begin{bmatrix}x_i\\y_i\end{bmatrix} - \begin{bmatrix}s_x\\s_y\end{bmatrix}\right\|^2 \quad (1)$$

where xi and yi represent a position in the X direction and a position in the Y direction, respectively, according to the design of the mark in the target shot region, and dxi and dyi represent an alignment measurement value in the X direction and an alignment measurement value in the Y direction, respectively. i is a number of a mark, and n is the number of marks. In addition, sx and sy represent a shift component in the X direction and a shift component in the Y direction, respectively, of the target relative position, and θx and θy represent a rotation component about the X-axis and a rotation component about the Y-axis, respectively, of the target relative position. βx and βy represent an extension component in the X direction and an extension component in the Y direction, respectively, of the target relative position. The alignment of the substrate S (target shot region) and the mold M can be controlled based on such components of the target relative position.

Here, if an abnormal value (for example, a value extremely different from the alignment measurement values of other marks) is included in each of the alignment measurement values dxi and dyi of the mark, it can become difficult to accurately control the alignment of the substrate S (target shot region) and the mold M. Hence, the controller 110 according to this embodiment can obtain the confidence of each piece of position information (alignment measurement values) by setting each mark as a measurement target. Subsequently, when a mark whose confidence is less than a threshold is present, the controller 110 can use the remaining marks to control the alignment of the substrate S and the mold M without using this mark. Alternatively, each component of the target relative position can be obtained by multiplying the alignment measurement values (position information) of each mark by a weight w in accordance with the confidence in the manner described in equation (2) below, and the alignment of the substrate S and the mold M can be controlled based on the obtained components of the target relative position. As a result, it will be possible to reduce the influence of an abnormal mark and accurately control the alignment of the substrate S and the mold M.

$$V = \frac{1}{n}\sum_{i=1}^{n}\left\|\begin{bmatrix}dx_iw_{xi}\\dy_iw_{yi}\end{bmatrix} - \begin{bmatrix}\beta_x & -\theta_y\\\theta_x & \beta_y\end{bmatrix}\begin{bmatrix}x_i\\y_i\end{bmatrix} - \begin{bmatrix}s_x\\s_y\end{bmatrix}\right\|^2 \quad (2)$$

In addition, the controller 110 may adjust the completion time of the alignment of the substrate S and the mold M in accordance with the confidence. This kind of adjustment can be effective in a case in which confidence that is lower than the threshold is obtained when a feature quantity of a mark image (image data) is not extracted or calculated normally because a concave portion forming the mark as a measurement target has been insufficiently filled with the imprint material IM. In such a case, since the concave portion of the measurement target (mark) will become sufficiently filled with the imprint material IM in accordance with the elapse of time and the feature quantity will eventually be able to be extracted or calculated normally, the confidence can also rise. That is, the alignment accuracy of the substrate S and the mold M can be improved by adjusting the completion time of the alignment in accordance with the confidence.

For example, the controller 110 may adjust the completion time of the alignment in accordance with the confidence obtained at an initial stage of the alignment of the substrate S and the mold M. More specifically, the execution time (that is, the completion time) of the alignment can be adjusted in accordance with the confidence obtained at an initial stage of the alignment based on information indicating a correspondence relationship between the confidence and the execution time of alignment in which the alignment accuracy will be a predetermined value or more. The information indicating the correspondence relationship can be obtained in advance by, for example, an experiment, a simulation, or the like. In addition, the controller 110 may sequentially (continuously) obtain the confidence and the position information (alignment measurement value) of a mark as a measurement target during the alignment of the substrate S and the mold M, and adjust the completion time of the alignment in accordance with the fact that the confidence has reached a threshold or more. In this case, the controller 110 may adjust the completion time of the alignment so that the alignment of the substrate S and the mold M will be performed within a predetermined time from the time at which the confidence has reached a threshold or more.

Figure 11:
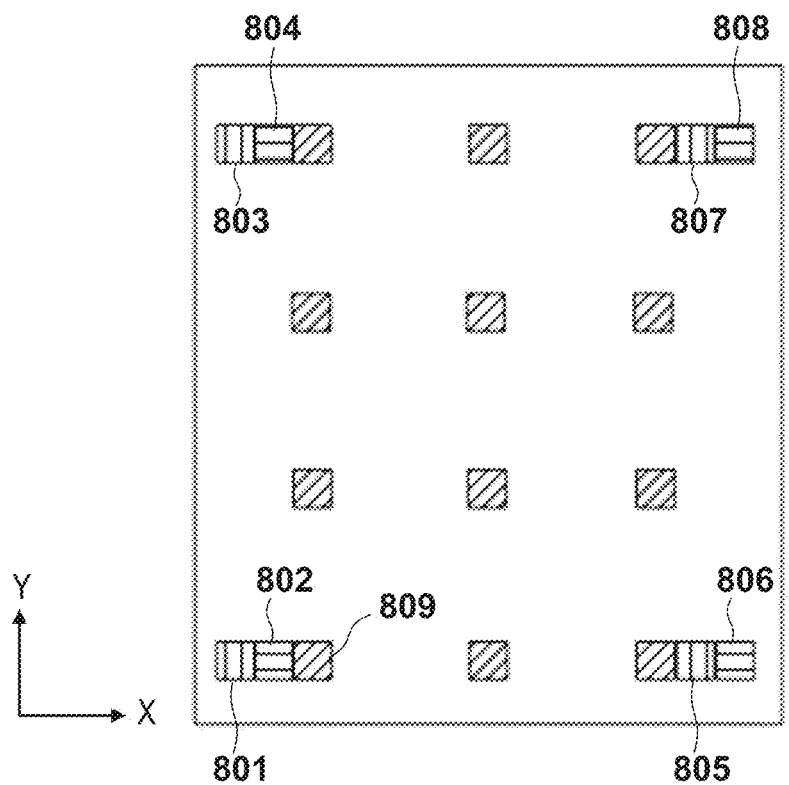
FIG. 11 is a view showing an example of the arrangement of alignment marks and inspection marks.

A verification result of this embodiment will be described below. This verification was performed by using eight alignment marks, which were alignment marks 801, 803, 805, and 807 in the X direction and alignment marks 802, 804, 806, and 808 in the Y direction in a shot region as shown in FIG. 11. Reference numeral 809 indicates marks (inspection marks) used by an overlay inspection apparatus. In this verification, an alignment error amount was calculated based on the position information obtained for each of the alignment marks 801 to 808 by using the alignment measuring device 106 and the overlay measurement result of the mark 809 near each alignment mark. As the position information to be used for calculating the alignment error amount, the position information (that is, the provisional position information) obtained before correction by the correction value based on a feature quantity of the image data in the non-measurement direction and the position information obtained after the correction were used. In addition, the data of 20 wafers×69 shot regions was used for the training for generating a model, and correction was subsequently performed on 6 wafers×69 wafers which were different from the data used for the training. Training and correction were performed independently for each of the positions of the alignment marks and each of the directions of the alignment marks.

Figure 12:
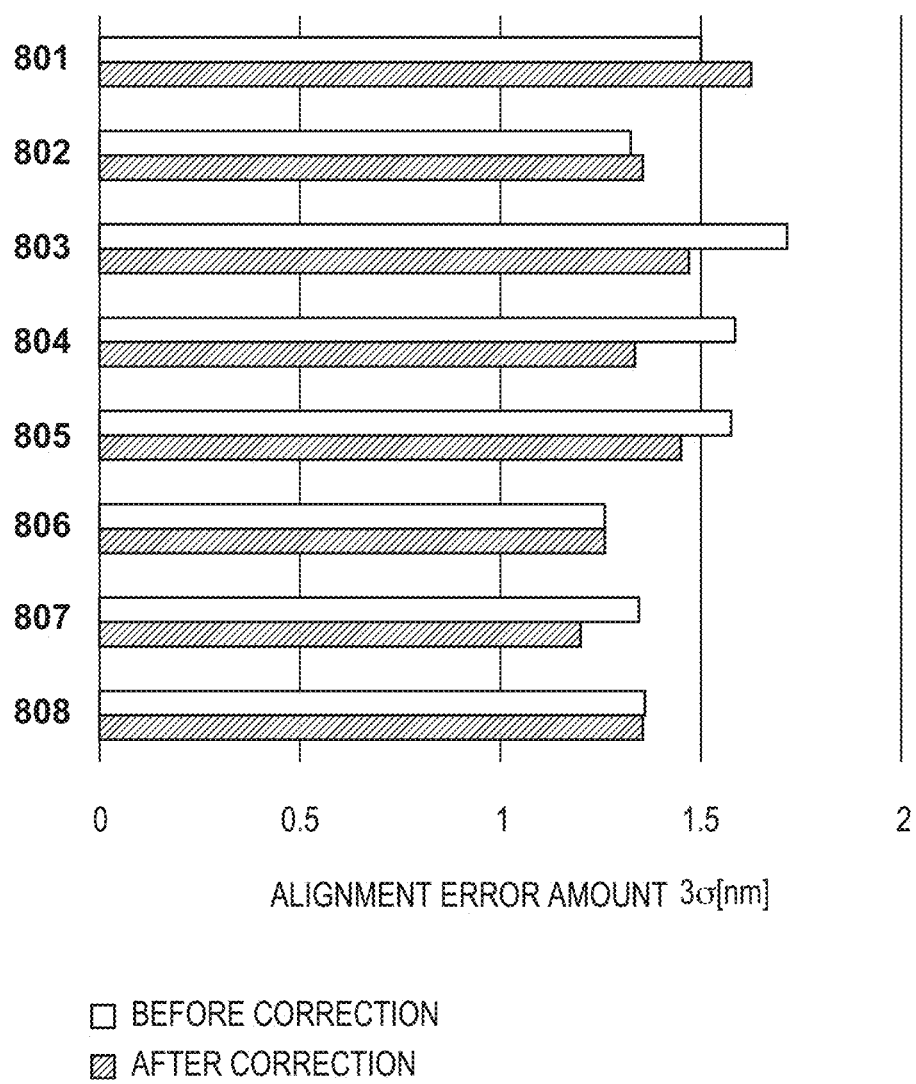
FIG. 12 is a view showing an example of alignment error amounts of the alignment marks.

FIG. 12 represents standard deviations of the alignment error amounts of all the pieces of data obtained before and after correction, and shows the degree of variation of each alignment error amount. An object of this embodiment is to minimize this variation, and it can be confirmed from this graph that the variation of each alignment error amount had decreased by a maximum of approximately 16%.

Figure 13A:
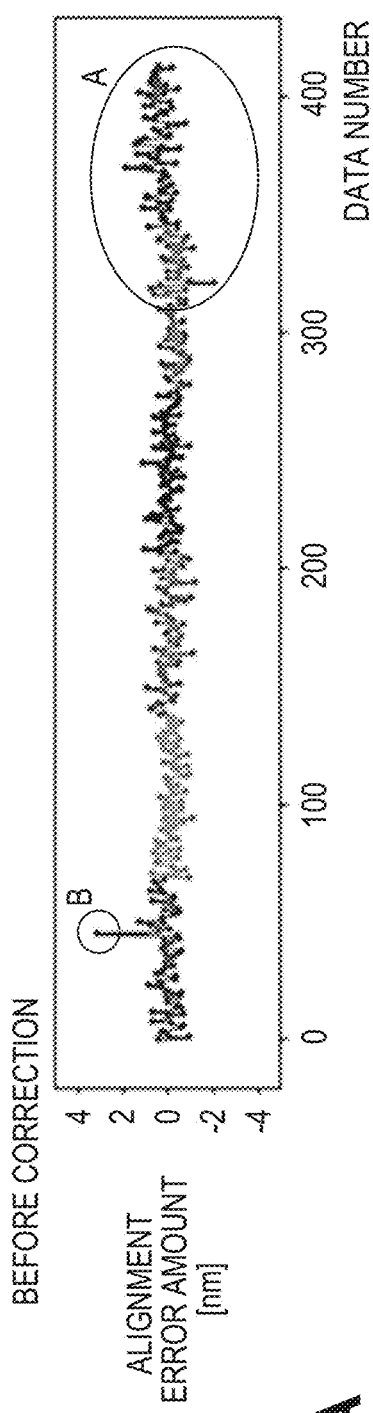
FIGS. 13A and 13B are graphs showing an example of the alignment error amounts of the alignment marks before correction and the alignment error amounts of the alignment marks after the correction, respectively.
Figure 13B:
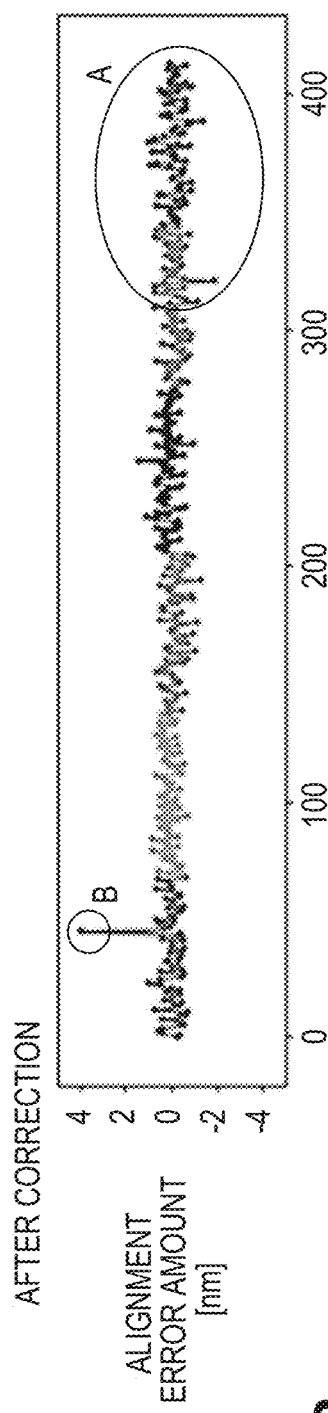
Figure 13C:
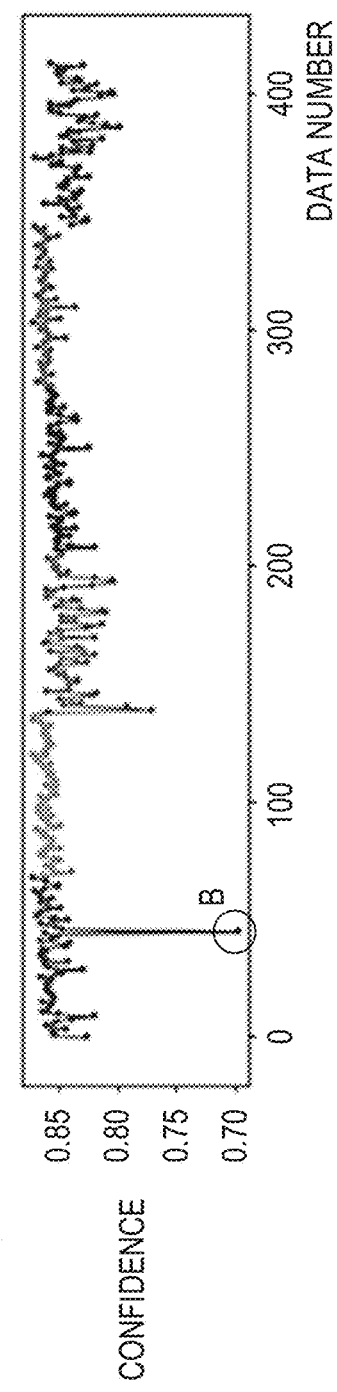
FIG. 13C is a graph showing an example of the confidence of position information.

FIGS. 13A and 13B are graphs displaying the alignment error amounts before correction and after correction, respectively, and the alignment error amounts of respective sets of data are aligned horizontally in each graph. FIG. 13A shows the alignment error amount of each piece of data before the correction, and FIG. 13B shows the alignment error amount of each piece of data after the correction. In addition, FIG. 13C shows the confidence, of each piece of data, obtained based on a feature quantity of image data in the non-measurement direction.

Referring to FIGS. 13A and 13B, it was confirmed in the data of the right-side portion surrounded by a circle A that the alignment error amount (and/or the variation of the alignment error amount) was reduced by the correction. Also, it is confirmed in the data surrounded by a circle B that the alignment error amount is very large compared to other data and that the alignment error amount has not been improved by the correction. When the confidence of this data is confirmed by using FIG. 13C, it is confirmed that the confidence of this data has become very small compared to the other data. This shows that an abnormality, for example, a state in which a mark is not formed in the actually intended shape or position, has occurred in the alignment mark from which the data surrounded by the circle B is obtained, and that a normal measurement result (position information) could not be obtained by the alignment measuring device 106.

An example in which a correction value calculated from data showing the state of the imprint apparatus IMP during an imprint process is applied to an overlay of a shot region of the data has been described above as an embodiment. However, the present invention is not limited to this. For example, the imprint apparatus IMP may provide a correction value to the control apparatus 1003, and this correction value may be used in subsequent processing. For example, a correction value obtained from information indicating the state of the imprint apparatus IMP during an imprint process may be applied during the alignment of another shot region such as the next shot region or the like. In addition, the correction value may also be applied during the alignment of a shot region arranged at an identical position in the next substrate.

In addition, although an example in which the correction value and/or the confidence is sequentially calculated during an imprint process has been described as an embodiment, the present invention is not limited to this. For example, the confidence of alignment measurement performed on each shot region of the substrate S (wafer) which has undergone an imprint process may be calculated, and abnormality detection of alignment marks may be performed based on the confidence.

Furthermore, the calculation/training and the like of the correction value and/or the confidence described above as an embodiment may not only be applied to an imprint apparatus, but also to another lithography apparatus (for example, an exposure apparatus). Alignment of a shot region of a substrate and an original is also performed in an exposure apparatus. In this alignment, the position of each mark provided in the shot region of the substrate can be measured, and the measurement result can be corrected by using a correction value corresponding to a feature quantity of the image data of each mark in the non-measurement direction. In addition, based on the confidence corresponding to the feature quantity of the image data of each mark in the non-measurement direction, the settings related to the use of the mark can be set.

Second Embodiment

The second embodiment of the present invention will be described. The first embodiment has described an example in which a model that can determine (calculate or estimate) both a correction value and the confidence is used to perform correction of an alignment measurement result and abnormality detection of each mark. The second embodiment will describe an example in which only the abnormality detection of each mark is performed by using a model that determines only the confidence without determining a correction value. Note that the second embodiment basically inherits the first embodiment and for example, the apparatus arrangement, the processing sequence, and the like are similar to those of the first embodiment. The second embodiment differs from the first embodiment in the model generation method (machine learning method) and the method for determining the confidence.

A model generation method according to this embodiment will be described. First, in this generation method, an imprint apparatus IMP performs an imprint process on a plurality of shot regions of a substrate S under the same condition, and obtains a feature quantity of each mark image (image data) used for alignment. This embodiment differs from the first embodiment in that an overlay inspection apparatus (an inspection apparatus 1005) does not measure an overlay shift amount. That is, a model which sets, as an input, a feature quantity of the mark image in at least the non-measurement direction, and outputs information indicating the confidence will be generated by executing machine learning without using the training data (unsupervised machine learning).

A method such as a principal component analysis, an autoencoder, or the like can be raised as an example of machine learning in this case. This kind of method such as a principal component analysis, an autoencoder, or the like is particularly effective when a feature quantity related to the non-measurement direction obtained from a mark image of an abnormal mark includes many random components. Each of these methods extracts a common feature from feature quantities used for machine learning, and calculates how much a target feature quantity to be used for determining the confidence can be described based on the extracted feature. Subsequently, the degree of a component capable of this description (for example, a degree including an extracted feature) can be determined as the confidence of the target feature quantity. That is, a high confidence value can be obtained as the degree to which a feature extracted from the feature quantities used for machine learning can be used for describing increases (for example, as the number of components capable of describing increases). Hence, since a feature quantity that is obtained from an abnormal mark and includes many random components will have few components which can be described by the extracted feature, a low confidence value will be calculated.

In addition, abnormality detection by One Class SVM is also effective if an abnormal mark is hardly present among marks (measurement targets) to be used for machine learning. In One Class SVM, for feature quantities used in machine learning, a boundary between a feature quantity obtained from a normal mark and a feature quantity obtained from an abnormal mark is calculated, and the confidence is obtained in accordance with a distance between the boundary and a target feature quantity whose confidence is to be determined.

Alternatively, as another method, there is a method of executing machine learning of the variance-covariance matrix and the average of feature quantities of mark images to be used in machine learning, and obtaining the confidence from a Mahalanobis distance between the average and a feature quantity of a target mark image whose confidence is to be determined.

In this manner, in this embodiment, a model is generated by using the method as described above, and the confidence of a measurement target can be determined (estimated) by using the model. For example, a model generated by the method described above can be obtained in step S301 of FIG. 5, and the model can be used to determine the confidence in step S306. Subsequently, abnormality detection of each mark as a measurement target can be performed based on the determined confidence, and settings related to the use of the position information of a mark can be set in step S307. Note that since an alignment error amount (correction value) is not calculated in the model generated according to this embodiment, another model for calculating a correction value can be used when an alignment measurement value (provisional position information) is to be corrected.

Third Embodiment

The third embodiment according to the present invention will be described. This embodiment basically inherits the first embodiment. Since matters other than those to be described below follow those described in the first embodiment, a description thereof will be omitted. In addition, this embodiment may include contents of the second embodiment.

The first embodiment has described an example in which a difference between a measurement value obtained by an overlay inspection apparatus and a measurement value (an alignment error ultimately obtained in step S104) obtained by an imprint apparatus IMP is calculated as an alignment error amount by a model generation apparatus 1007 in step S201. In addition, in the first embodiment, a mark image obtained by the model generation apparatus 1007 in step S202 is an image obtained in step S104 by using an alignment measuring device 106 in the imprint apparatus IMP before curing of an imprint material.

In contrast, in this embodiment, as the measurement value and the mark image of the imprint apparatus IMP, a measurement value and a mark image obtained by the alignment measuring device 106 in the imprint apparatus IMP between the processes of steps S105 and S106, that is, after the imprint material has been cured are used.

In addition, in this embodiment, in step S202, a feature quantity is obtained from this mark image captured after the imprint material has been cured. This feature quantity can include at least a feature quantity related to the non-measurement direction, and may also include a feature quantity related to the measurement direction.

A substrate S which is to be measured by an external overlay inspection apparatus is in a state in which the imprint material has been cured. Hence, by using a correction value and a mark image obtained after the curing of the imprint material as the measurement value and the mark image of the imprint apparatus IMP according to this embodiment, it will be possible to eliminate a change generated when the imprint material is cured.

Fourth Embodiment

The fourth embodiment of the present invention will be described. An exposure apparatus will be exemplified as a lithography apparatus in this embodiment. Note that unless particularly mentioned below, this embodiment basically inherits the first embodiment. For example, unless particularly mentioned below, the model generation method, the method of determining the confidence, and the like inherit those of the first embodiment. In addition, this embodiment may include the contents of the second embodiment and/or the third embodiment.

Figure 17:
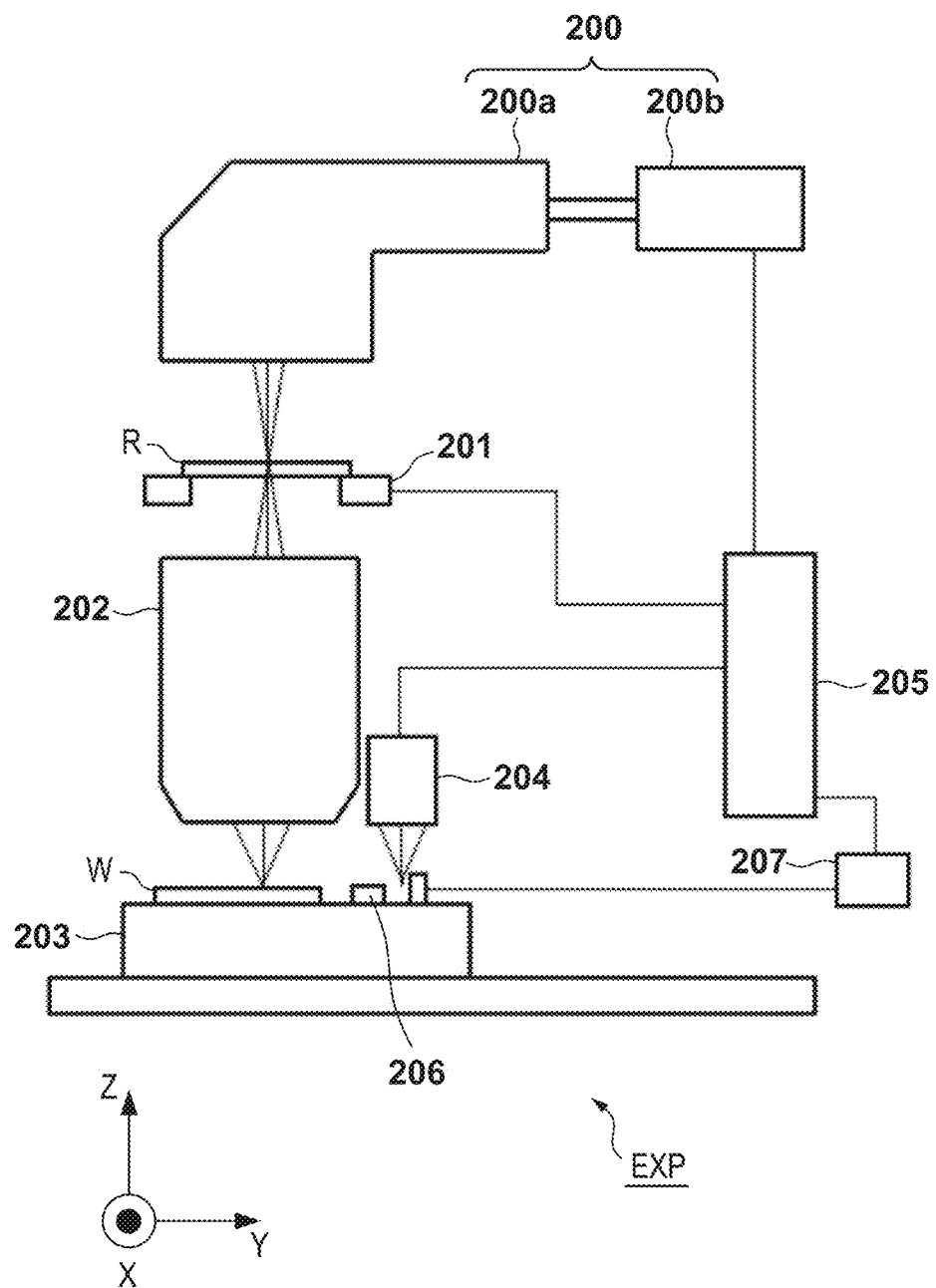
FIG. 17 is a view showing an example of the arrangement of an exposure apparatus.

FIG. 17 schematically shows the arrangement of an exposure apparatus EXP according to an embodiment. The exposure apparatus EXP can include an illumination device 200, a reticle stage 201 for holding a reticle R as an original, a projection optical system 202, a wafer stage 203 for holding a wafer W as a substrate, a mark position measuring device 204, and a controller 205. A reference plate 206 is arranged on the wafer stage 203. The controller 205 includes a CPU and a memory, is electrically connected to the illumination device 200, the reticle stage 201, the wafer stage 203, and the mark position measuring device 204, and controls these components to comprehensively control the operation of the exposure apparatus EXP.

The controller 205 can be formed by, for example, a PLD (the abbreviation of a Programmable Logic Device) such as an FPGA (the abbreviation of a Field Programmable Gate Array), an ASIC (the abbreviation of an Application Specific Integrated Circuit), a general-purpose computer embedded with a program 113 or a combination of all or some of these components. In addition, the controller 205 according to this embodiment can be formed to calculate a correction value for correcting the position information (provisional position information) of a measurement target (for example, a mark on the wafer W) obtained by using the mark position measuring device 204 and/or to determine the confidence of the position information of the mark. The controller 205 can also include a model generation apparatus 1007 (machine learning controller) described above in the first and second embodiments.

The illumination device 200 includes a light source portion 200a and an illumination optical system 200b, and illuminates the reticle R held by the reticle stage 201. The light source portion 200a uses, for example, a laser. Although an ArF excimer laser having a wavelength of approximately 193 nm, a KrF excimer laser having a wavelength of approximately 248 nm, or the like can be used as the laser, the type of the light source is not limited to an excimer laser. More specifically, an F2 laser having a wavelength of approximately 157 nm or EUV (Extreme Ultra Violet) light having a wavelength of 20 nm or less may be used. In addition, the illumination optical system 200b may have a polarized illumination function and a function for uniformly illuminating the reticle R. The illumination optical system 200b is an optical system that uses a light beam emitted from the light source portion 200a to illuminate a surface to be illuminated, and illuminates the reticle R by forming the light beam into an exposure slit having a predetermined shape optimal for exposure in this embodiment. The illumination optical system 200b can include a lens, a mirror, an optical integrator, a stop, and the like. For example, a condenser lens, a fly-eye lens, an aperture stop, a condenser lens, a slit, and an image forming optical system are arranged in this order in the illumination optical system 200b.

The reticle R is made of, for example, quartz, and a circuit pattern to be transferred to onto the wafer W is formed thereon. The reticle R is held and driven by the reticle stage 201, and can be illuminated by the illumination device 200. Diffracted light that is transmitted through the reticle R passes through the projection optical system 202 and is projected onto the wafer W. Also, the reticle stage 201 includes a reticle chuck for holding the reticle R and a reticle driving mechanism for driving the reticle R by driving the reticle chuck. The reticle driving mechanism is formed by a linear motor or the like, and can drive the reticle R in the X-axis direction, the Y-axis direction, the Z-axis direction, and the rotation directions of the respective axes. Note that a reticle detection device having an oblique incidence system (not shown) is provided in the exposure apparatus EXP, and the reticle detection device can detect the position of the reticle R by using the reticle detection device and control the position of the reticle R based on the detection result.

The projection optical system 202 has a function to form the light beam from an object surface into an image on an image surface and, in the present invention, forms (projects) the diffracted light that has passed through a pattern formed on the reticle R into an image on the wafer W. Although an optical system formed by a plurality of lens elements can be used as the projection optical system 202, another kind of optical system may be used. For example, an optical system (catadioptric optical system) which includes a plurality of lens elements and at least one concave mirror, an optical system which includes a plurality of lens elements and at least one a diffraction optical element such as a kinoform, or the like can be used as the projection optical system 202.

The wafer W is, for example, a member to be processed such as a semiconductor wafer, a liquid-crystal substrate, or the like, and a photoresist is applied on the wafer W. In this embodiment, since the mark position measuring device 204 will detect (capture an image of) each mark of the wafer W, the wafer W and/or each mark of the wafer W can be understood to be a measurement target of the mark position measuring device 204. In addition, the wafer stage 203 includes a wafer chuck for holding the wafer W and a wafer driving mechanism for driving the wafer W by driving the wafer chuck. The wafer driving mechanism is formed by a linear motor or the like, and can drive the wafer W in the X-axis direction, the Y-axis direction, the Z-axis direction, and the rotation directions of the respective axes. Note that a surface position detection device (not shown) is provided in the exposure apparatus EXP. The surface position detection device can detect the surface position of the wafer W, and the surface position (for example, the height of the wafer W) of the wafer W can be controlled based on the detection result.

A relative position between the reticle stage 201 and the wafer stage 203 is measured (monitored) by, for example, a six-axis laser interferometer 207, and the relative position between the reticle R and the wafer W can be controlled based on the measurement result by the controller 205 during the exposure of the wafer W. For example, the reticle R and the wafer W are arranged to have an optically conjugate relationship, and the pattern of the reticle R can be transferred onto the wafer W by relatively scanning the reticle R and the wafer W at a speed ratio corresponding to the projection magnification of the projection optical system 202.

Figure 18A:
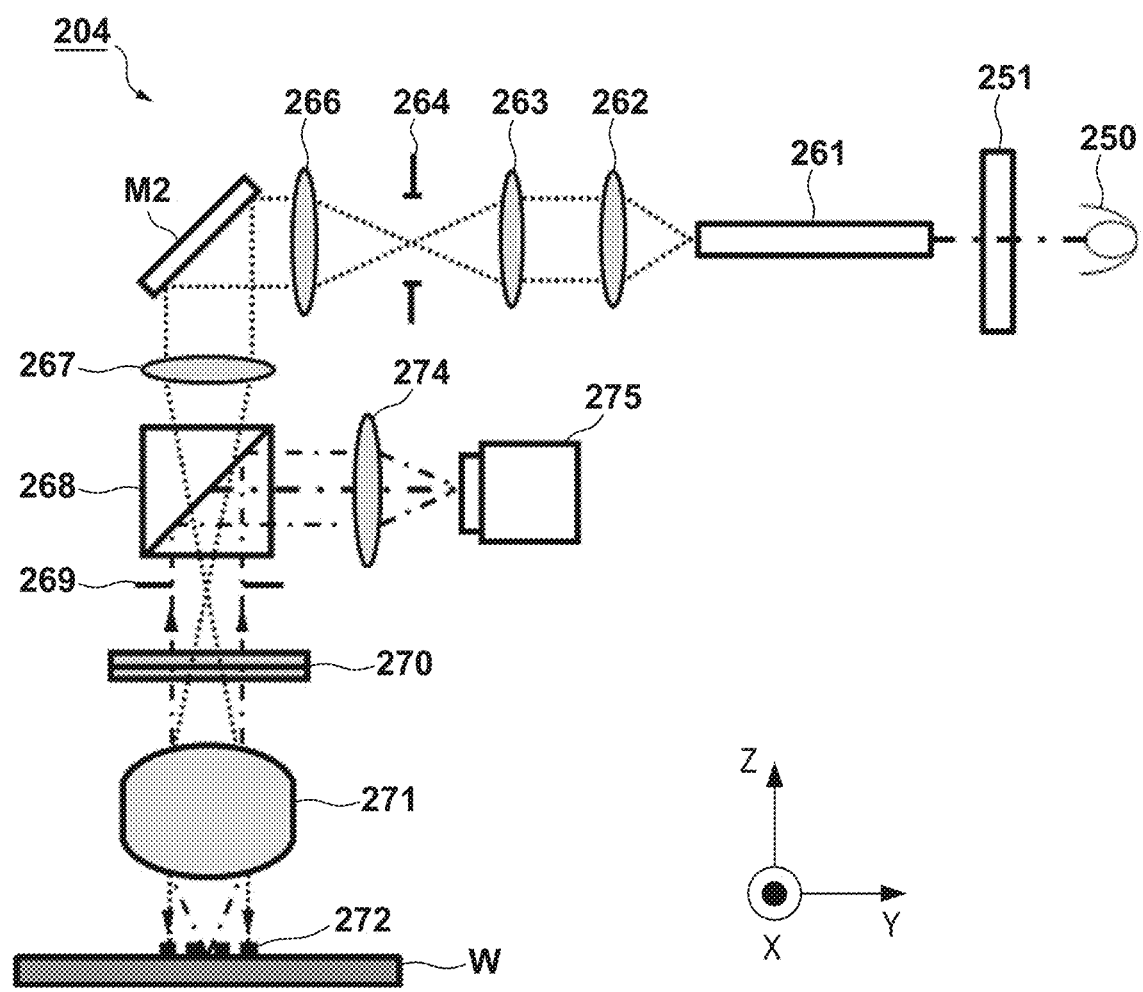
FIG. 18A is a view showing an example of the arrangement of a mark position measuring device.

FIG. 18A schematically shows the arrangement of the mark position measuring device 204 according to an embodiment. The mark position measuring device 204 can be formed by an illumination system for illuminating the wafer W with light emitted from an optical fiber 261 and an image forming system for forming an image of a mark 272 provided on the wafer W, and can generate image data (mark image) by capturing an image of the mark 272 of the wafer W. The mark position measuring device 204 can be understood to be a unit similar to an alignment measuring device (image capturing device) 106 described in the first embodiment. The illumination system can include an illumination optical system (lenses 262, 263, and 266), an illumination aperture stop 264, a mirror M2, a relay lens 267, a polarized beam splitter 268, a $\lambda/4$ plate 270, and an object optical system 271. Also, the image forming system includes the object optical system 271, the $\lambda/4$ plate 270, a detection aperture stop 269, the polarized beam splitter 268, and an image forming optical system 274, and is formed to form light reflected from the mark 272 into an image on a sensor 275 (light receiving surface). Based on a mark image (image data and a signal waveform) obtained by using the mark position measuring device 204, which is arranged in this manner, and the position of the wafer stage WS measured by the laser interferometer 207, the controller 205 can obtain the coordinate position (position information) of the mark 272.

In the mark position measuring device 204, the light emitted from the optical fiber 261 passes through the lenses 262 and 263 of the illumination optical system and reaches the illumination aperture stop 264 arranged in a position which is conjugate to the wafer W. At this time, the diameter of the light beam at the illumination aperture stop 264 will be sufficiently smaller than the diameter of the light beam at the optical fiber 261. The light that passed through the illumination aperture stop 264 is guided to the polarized beam splitter 268 via the lens 266 of the illumination optical system, the mirror M2, and the relay lens 267. Here, for example, the polarized beam splitter 268 can be arranged to transmit p-polarized light which is parallel to one of the X direction and the Y direction and to reflect s-polarized light which is parallel to the other of the X direction and the Y direction. Hence, after the p-polarized light transmitted through the polarized beam splitter 268 has passed through the detection aperture stop 269, the p-polarized light is transmitted through the $\lambda/4$ plate 270 and converted into circularly polarized light. Subsequently, the circularly polarized light will pass through the object optical system 271 and illuminate the mark 272 of the wafer W in a Kohler illumination.

After the light reflected/diffracted/scattered by the mark 272 is passed through the object optical system 271 again, the light is transmitted through the λ/4 plate 270 to be converted from the circularly polarized light into s-polarized light, and the converted s-polarized light reaches the detection aperture stop 269. Here, the polarization state of the light reflected by the mark 272 will be circularly polarized light with a rotation in reverse of that of the circularly polarized light which irradiated the mark 272. That is, if the polarization state of the light that irradiated the mark 272 is clockwise circular polarization, the polarization state of the light reflected by the mark 272 will be counterclockwise circular polarization. In addition, the detection aperture stop 269 can change the aperture amount in accordance with an instruction from the controller 205 to change the numerical aperture of the reflected light from the mark 272. The light that passed through the detection aperture stop 269 is reflected by the polarized beam splitter 268, passes through the image forming optical system 274, and is subsequently guided to the sensor 275. In this manner, in the mark position measuring device 204 according to this embodiment, the optical path of the illumination light to the wafer W and the optical path of the reflected light from the wafer W can be separated by the polarized beam splitter 268, and an image of the mark 272 of the wafer W can be formed on the light receiving surface of the sensor 275.

The light emitted from a light source 250 which is, for example, a halogen lamp, a metal-halide lamp, a plasma light source, an LED, or the like will be guided to the lens 262 of the illumination optical system by the optical fiber 261. A wavelength filter 251 which can change the wavelength to be transmitted is arranged between this light source 250 and the optical fiber 261. The wavelength filter 251 can be formed to allow an optimal wavelength of illumination light to be transmitted based on a quality (for example, the contrast or the measurement bias) of a mark image obtained by the mark position measuring device 204. However, the filtering method and the arrangement of the wavelength filter 251 is not limited.

Figure 18B:
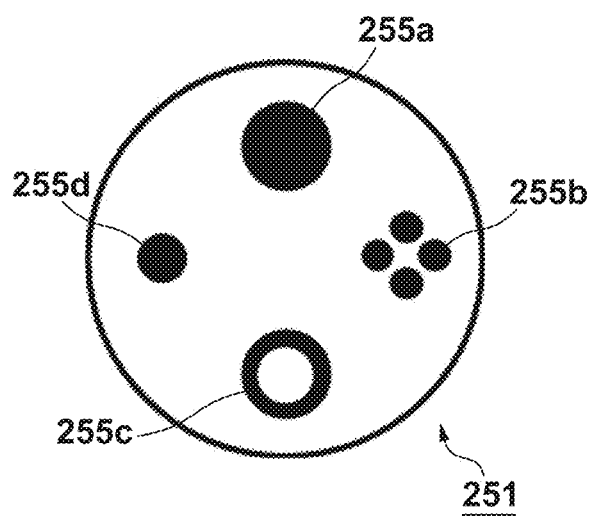
FIG. 18B is a view showing an example of the arrangement of an illumination aperture stop of the mark position measuring device.

The illumination aperture stop 264 includes a switching mechanism (a rotation mechanism in this example) for switching the shape of the aperture portion for transmitting light, and can change the shape of a transmitted light source distribution. This arrangement can allow the size (the so-called illumination σ value) of the aperture portion to be selected or allow modified illumination to be performed. The quality of the mark image obtained by the mark position measuring device 204 can also be changed by switching the shape of this aperture portion. As an example, in the illumination aperture stop 264 according to this embodiment, four kinds of aperture portions 255a to 255d which have different shapes are provided in the rotation mechanism as shown in FIG. 18B. The state of illumination on the mark 272 of the wafer W can be changed by driving the rotation mechanism so that one of these four kinds of aperture portions 255a to 255d will be arranged on the optical path. Note that the shapes of the aperture portion are not limited to the shapes shown in FIG. 18B, and may be arbitrarily set and changed.

As described above, the quality of the mark image obtained by the mark position measuring device 204 can be changed by changing the optical parameters (optical conditions) of the wavelength filter 251, the illumination aperture stop 264, and/or the detection aperture stop 269. An example of this will be described below with reference to FIG. 19, FIGS. 20A to 20E, and FIGS. 21A to 21E.

Figure 19:
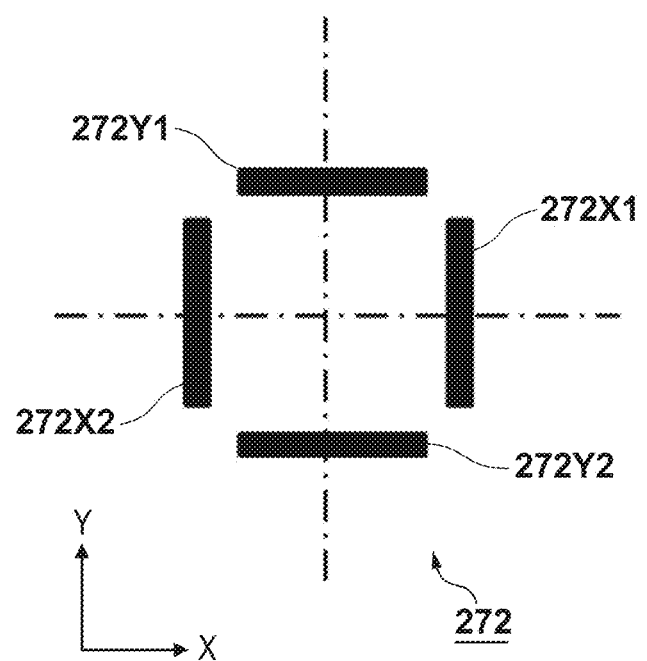
FIG. 19 is a view showing an example of the arrangement of alignment marks.

FIG. 19 shows an example of the mark 272 in an X-Y plane. The mark 272 shown in FIG. 19 can be formed by mark elements 272X1 and 272X2 for measuring a position in the X direction and mark elements 272Y1 and 272Y2 for measuring a position in the Y direction. The mark position measuring device 204 will generate a mark image (image data) by capturing an image of the mark 272. Subsequently, the mark position measuring device 204 or the controller 205 will measure the position of the mark 272 (each mark element) by processing the mark image. In such mark 272, a measurement error (measurement bias) may occur due to, for example, an influence from a process such as CHIP (chemical-mechanical polishing), etching, unevenness in resist coating, or the like of the semiconductor process. Particularly, in the mark 272 or the like which is used for performing bidirectional measurement in this manner, the mark shape may become asymmetrical (to be described later) not only in the measurement direction but also in a direction (non-measurement direction) which is not the measurement direction.

Figure 20A:
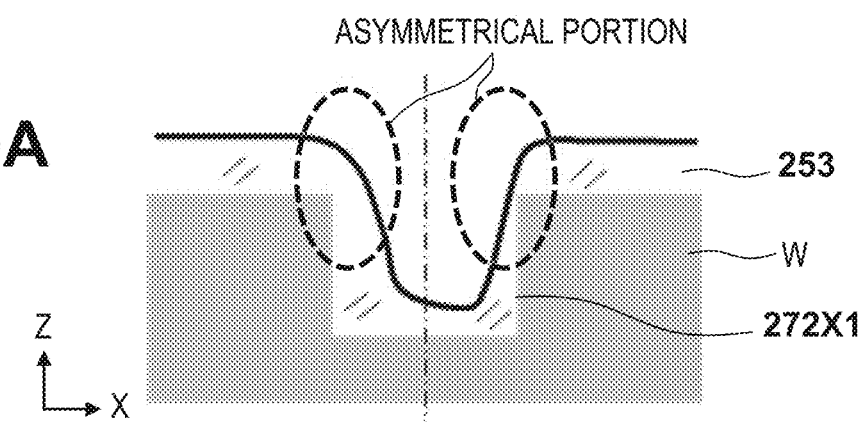
FIGS. 20A to 20E are views showing an example of the arrangement of an alignment mark and a signal waveform (in a measurement direction) obtained from image data of the alignment mark.

FIG. 20A focuses on the mark element 272X1 which is one of the four mark elements forming the mark 272 shown in FIG. 19, and shows the section of this mark element 272X1 (Z-X section). The mark element 272X1 is formed to have a step structure, and a resist 253 is applied thereon. In general, the resist 253 can be applied in a liquid state onto the entire surface of the wafer W by spin coating. When the liquid resist 253 is applied by spin coating on the mark element 272X1 which has a step structure in this manner, the thickness of the resist can become asymmetrical in the measurement direction (X direction) in accordance with, for example, the position of the mark element 272X1 on the wafer W. In such a case, an asymmetrical component will be generated in the mark image of the mark element 272X1 obtained by the mark position measuring device 204, thus generating a measurement error (measurement bias) in the measurement result of the mark position.

FIG. 21A focuses on the mark element 272X1 which is one of the four mark elements forming the mark 272 shown in FIG. 19, and shows a plan view (X-Y plane) of the mark element 272X1. The mark element 272X1 is formed to have a step structure, and the resist 253 is applied thereon. As described above, in general, the resist 253 can be applied in a liquid state onto the entire surface of the wafer W by spin coating. In this case, in a similar manner to the measurement direction described with reference to FIG. 20A, the thickness of the resist can also become asymmetrical in the non-measurement direction (for example, the Y direction) in accordance with, for example, the position of the mark element 272X1 on the wafer W. That is, the shape of the edge of the mark image in the non-measurement direction obtained by the mark position measuring device 204 can be asymmetrical. This kind of asymmetry in the non-measurement direction can be correlated to the asymmetry in the measurement direction (for example, the same tendency can be obtained).

FIGS. 20B to 20E each show a signal waveform in the measurement direction of a mark image obtained when the above-described optical parameters are changed. The abscissa indicates the position in the X direction (measurement direction), and the ordinate indicates the signal intensity. In addition, FIGS. 21B to 21E each show a signal waveform in the non-measurement direction of a mark image obtained when the above-described optical parameters are changed. The abscissa indicates the vibration intensity, and the ordinate indicates the position in the Y direction (non-measurement direction). The signal waveforms of FIGS. 21B to 21E are signal waveforms obtained under the same conditions (that is, the same optical parameters) as in FIGS. 20B to 20E, respectively.

Figure 20B:
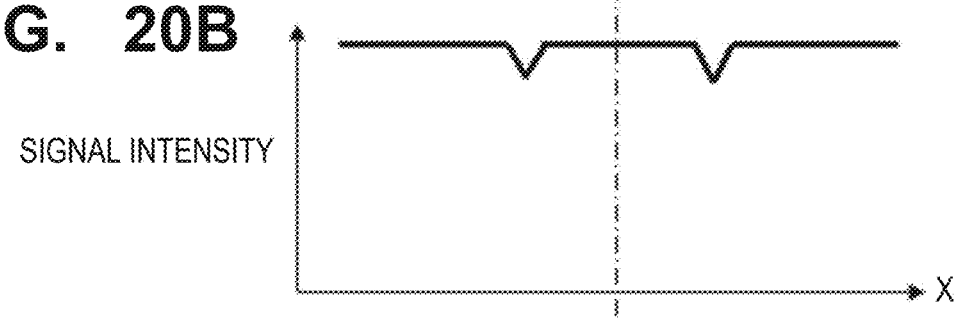

FIGS. 20B and 21B each show an example of a waveform of a mark image obtained under given optical parameters (the wavelength and the illumination σ value). The signal waveform shown in each of FIGS. 20B and 21B has a comparatively low signal intensity (contrast). Since the measurement accuracy will decrease when the signal intensity is low in this manner, it is preferable to change the optical parameters so that the signal intensity will increase. On the other hand, FIGS. 20C and 21C each show an example of a signal waveform obtained when the wavelength has been changed with respect to the optical parameters of the signal waveform shown in each of FIGS. 20B and 21B. It can be seen that the signal intensity has increased more than that of the signal waveform shown in each of FIGS. 20B and 21B. In this case, since the asymmetry of the signal intensity caused by the asymmetry of the thickness of the resist will also become prominent, it can increase the possibility that a measurement error will occur.

Figure 20C:
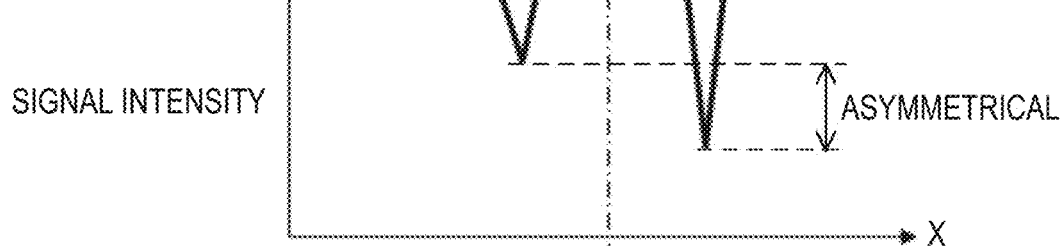
Figure 20D:
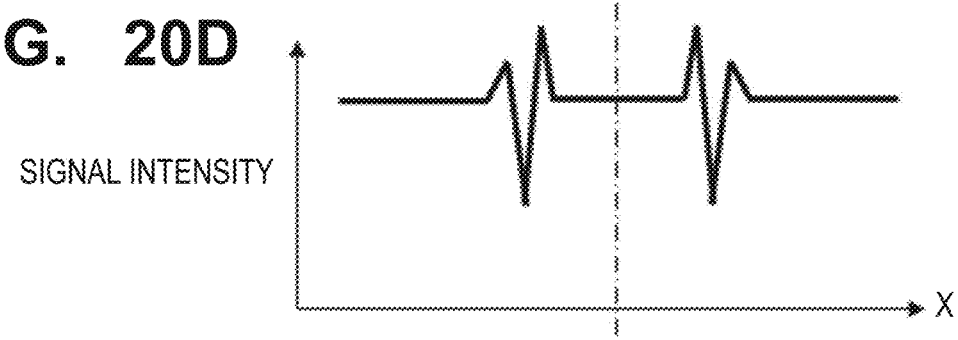

FIGS. 20D and 21D each show an example of a signal waveform obtained when the illumination σ value is reduced more than that of the optical parameters of the signal waveform of each of FIGS. 20C and 21C described above. By reducing the illumination σ value, it will be possible to increase the contrast by generating signal cooperation in a position corresponding to the peripheral portion of the mark element 272X1. In addition, the amount of signal cooperation to be generated, the position where the signal cooperation is to be generated in the X direction, and the like can be changed by changing the focus position of the mark position measuring device 204. Hence, it is preferable to adjust the illumination a value and/or the focus position in accordance with each condition (the contrast, the measurement bias, or the like) for obtaining a mark image.

Figure 20E:
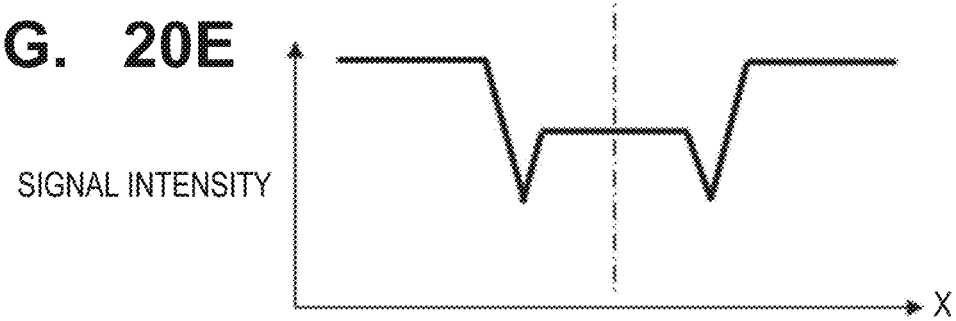

FIGS. 20E and 21E each show an example of a signal waveform obtained when the wavelength of the illumination light has been increased more than that of the optical parameters of the signal waveform of each of FIGS. 20B and 21B. Since the resist 253 is applied on the mark element 272X1, the condition for the interference in the concave portion and the condition for the interference in the convex portion are different in the step structure of the mark element 272X1. For example, if a phase difference occurs between the concave portion and the convex portion, the relationship between the signal intensity of the concave portion and the signal intensity of the convex portion will change. The change in contrast that is generated by changing the wavelength of the illumination light in this manner may also become more prominent in a mark other than a mark with a step structure according to this embodiment. For example, it may become more prominent in a mark which can be used in an actual semiconductor process. In any case, the state of the mark image obtained by the mark position measuring device 204 will change by changing the wavelength of the illumination light in accordance with the structure of the mark element 272X1.

In this manner, a measurement error (measurement bias) can occur in the mark 272 (mark element 272X1) with the step structure due to the asymmetry of the resist 253 applied thereon. Hence, a feature quantity of a mark image (image data and a signal waveform) related to the non-measurement direction is obtained also in this embodiment in a manner similar to the first embodiment, and the provisional position information of the mark (measurement target) in the measurement direction obtained from the image data can be corrected based on the feature quantity. This will allow the position information of the mark to be determined accurately. Although the feature quantity of the mark image related to the non-measurement direction has been described in the first embodiment, a plurality of positions in the non-measurement direction can include, as an example, a corresponding plurality of values. The plurality of values may include a plurality of integrated values, and each of the plurality of integrated values can be an integrated value of the signal values of pixels whose positions are equal to each other in the non-measurement direction, among the plurality of pixels forming the image data. Refer to the first embodiment for a description of other methods for obtaining the feature quantity.

In addition, based on the above description, it can be said that a feature quantity of a mark image related to the non-measurement direction reflects an asymmetry (for example, unevenness in the thickness of a resist) in the measurement direction. Hence, the confidence of the position information of the mark determined from the mark image can be obtained based on the feature quantity, and the settings related to the use of the position information of the mark can be set based on the confidence. Refer to the first embodiment for a description of the method for obtaining the confidence and the setting method related to the use of the position information of the mark.

Note that since the embodiments of the present invention have mainly described an imprint apparatus, the alignment of each mark on the substrate S and each mark on the mold M have been described. However, in a case in which the present invention is to be applied to a measuring device for measuring a measurement target, for example, a semiconductor substrate or the like, each embodiment can be applied to measure a shift amount (distance) between marks on a substrate or to measure a shift (distance) between a mark on a substrate and a reference position (stage reference position).

<Embodiment of Method of Manufacturing Article>

A method of manufacturing an article according to the embodiment of the present invention is suitable for manufacturing an article such as a microdevice such as a semiconductor device or an element having a microstructure. The method of manufacturing an article according to the embodiment can include a step of forming a pattern on a substrate by using the above-described lithography apparatus and a step of processing the substrate on which the pattern has been formed in the preceding step, and an article is manufactured from the substrate processed in the processing step. Furthermore, this manufacturing method can include other well-known steps (oxidization, deposition, vapor deposition, doping, planarization, etching, resist removal, dicing, bonding, packaging, and the like). The method of manufacturing an article according to the embodiment is superior to a conventional method in at least one of the performance, the quality, the productivity, and the production cost of an article.

A method of manufacturing an article by using, as an example, an imprint apparatus as a lithography apparatus will be described hereinafter with reference to FIGS. 22A to 22F. The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

A more specific method of manufacturing an article will be described next. As shown FIG. 22A, a substrate $1z$ such as a silicon wafer with a processed material $2z$ such as an insulator formed on the surface is prepared. Next, an imprint material $3z$ is applied to the surface of the processed material $2z$ by an inkjet method or the like. A state in which the imprint material $3z$ is applied as a plurality of droplets onto the substrate is shown here.

Figure 22A:
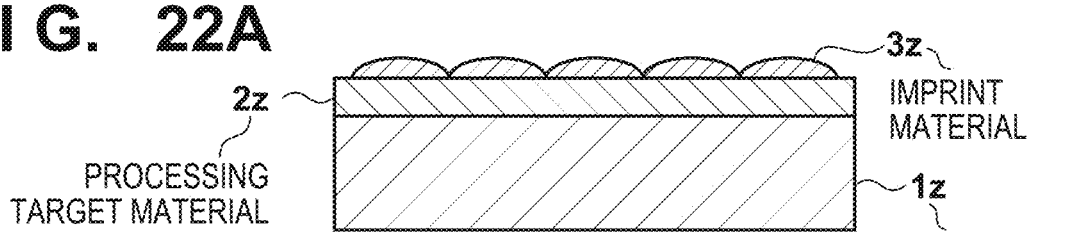
FIGS. 22A to 22F are views for explaining a method of manufacturing an article.
Figure 22B:
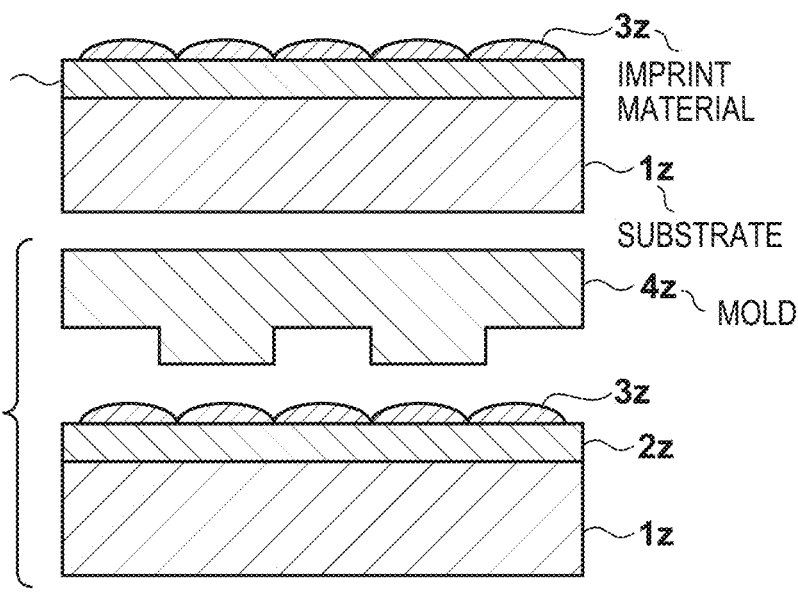
Figure 22C:
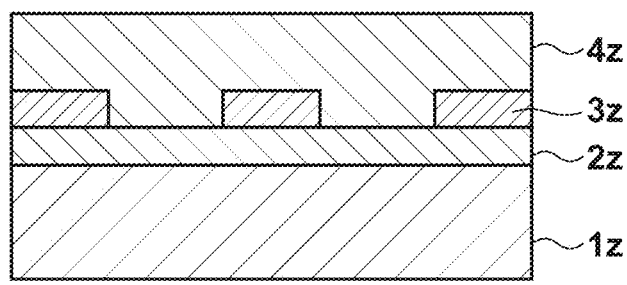

As shown in FIG. 22B, a side of a mold $4z$ for imprint with a concave-convex pattern is directed toward and made to face the imprint material $3z$ on the substrate. As shown FIG. 22C, the substrate $1z$ to which the imprint material $3z$ is applied is brought into contact with the mold $4z$, and a pressure is applied. The gap between the mold $4z$ and the processed material $2z$ is filled with the imprint material $3z$. In this state, when the imprint material $3z$ is irradiated with light as energy for curing via the mold $4z$, the imprint material $3z$ is cured.

Figure 22D:
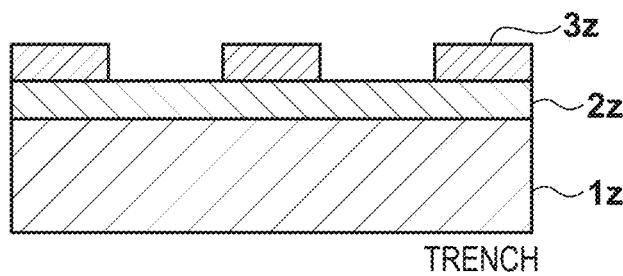

As shown in FIG. 22D, after the imprint material $3z$ is cured, the mold $4z$ is separated from the substrate $1z$, and the pattern of the cured product of the imprint material $3z$ is formed on the substrate $1z$. In the pattern of the cured product, the concave portion of the mold corresponds to the convex portion of the cured product, and the convex portion of the mold corresponds to the concave portion of the cured product. That is, the concave-convex pattern of the mold $4z$ is transferred to the imprint material $3z$.

Figure 22E:
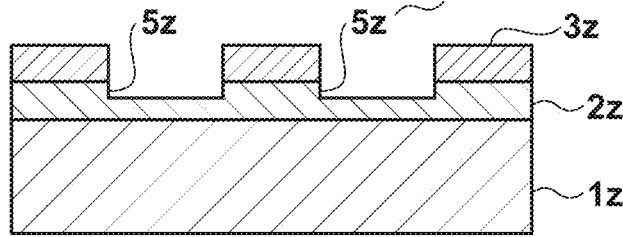
Figure 22F:
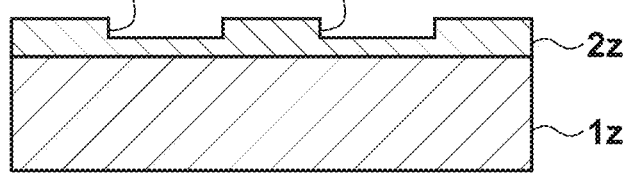

As shown in FIG. 22E, when etching is performed using the pattern of the cured product as an etching resistant mask, a portion of the surface of the processed material $2z$ where the cured product does not exist or remains thin is removed to form a groove $5z$. As shown in FIG. 22F, when the pattern of the cured product is removed, an article with the grooves $5z$ formed in the surface of the processed material $2z$ can be obtained. Here, the pattern of the cured product is removed. However, instead of removing the pattern of the cured product after the process, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-177445 filed on Oct. 22, 2020, and Japanese Patent Application No. 2021-142700 filed on Sep. 1, 2021, which are hereby incorporated by reference herein in their entirety.

What is claimed is:

1. A processing apparatus comprising:
a generator configured to generate, based on image data of a measurement target, position information of the measurement target in a first direction; and
a determinator configured to determine, based on a feature quantity of the image data of the measurement target related to a second direction different from the first direction, confidence of the position information of the measurement target in the first direction generated by the generator,
wherein the measurement target is a mark that is detected to obtain the position information in the first direction.

2. The processing apparatus according to claim 1, wherein the determinator determines the confidence from the feature quantity by using a model configured to obtain the confidence based on the feature quantity.

3. The processing apparatus according to claim 2, wherein the model uses the feature quantity as an input and outputs a probability distribution of an error estimated to be included in the position information generated by the generator, and the determinator determines, as the confidence, a variance of the probability distribution output from the model.

4. The processing apparatus according to claim 2, further comprising:
a machine learning controller configured to generate the model by performing machine learning by using the feature quantity as input data and a measurement value of an error, included in the position information generated by the generator, as training data.

5. The processing apparatus according to claim 3, wherein the measurement value of the error is obtained by a difference between the position information of the measurement target generated by the generator and position information of the measurement target measured by an external inspection apparatus.

6. The processing apparatus according to claim 2, further comprising:
a machine learning controller configured to generate the model by performing unsupervised machine learning by using the feature quantity as input data.

7. The processing apparatus according to claim 1, further comprising:
a setting unit configured to set, based on the confidence determined by the determinator, a setting related to a use of the position information of the measurement target in the first direction generated by the generator.

8. The processing apparatus according to claim 7, wherein the setting unit sets, based on the confidence determined by the determinator, whether to use the position information of the measurement target in the first direction generated by the generator.

9. The processing apparatus according to claim 7, wherein the setting unit sets, based on the confidence determined by the determinator, a weight added to the position information of the measurement target in the first direction generated by the generator.

10. The processing apparatus according to claim 1, wherein the feature quantity obtained from the image data related to the second direction includes a plurality of values corresponding to a plurality of positions in the second direction.

11. The processing apparatus according to claim 10, wherein the plurality of values include a plurality of integrated values, and each of the plurality of integrated values is an integrated value of signal values of pixels whose positions in the second direction are equal to each other among a plurality of pixels forming the image data.

12. The processing apparatus according to claim 10, wherein the plurality of values include signal values of a plurality of pixels on a line parallel to the second direction among a plurality of pixels forming the image data.

13. The processing apparatus according to claim 10, wherein the plurality of values are obtained by processing signal values of a plurality of pixels on a line parallel to the second direction among a plurality of pixels forming the image data.

14. The processing apparatus according to claim 10, wherein the plurality of values are obtained by performing basis transformation on a plurality of integrated values, and each of the plurality of integrated values is an integrated value of signal values of pixels whose positions in the second direction are equal to each other among a plurality of pixels forming the image data.

15. The processing apparatus according to claim 10, wherein the plurality of values are obtained by performing basis transformation on signal values of a plurality of pixels on a line parallel to the second direction among a plurality of pixels forming the image data.

16. The processing apparatus according to claim 10, wherein the plurality of values are obtained by performing basis transformation on a plurality of values obtained by processing signal values of a plurality of pixels on a line parallel to the second direction among a plurality of pixels forming the image data.

17. A measurement apparatus that measures a position of a measurement target, comprising:
an image capturing device configured to generate image data by capturing an image of the measurement target; and
a processing apparatus defined in claim 1 and configured to process the image data obtained by the image capturing device,
wherein based on the image data obtained by the image capturing device, the processing apparatus generates position information of a measurement target and determines confidence of the position information.

18. A lithography apparatus that transfers a pattern of an original onto a substrate, comprising:
a measurement apparatus defined in claim 17; and
a controller configured to control, based on an output of the measurement apparatus, alignment of the substrate and the original.

19. The lithography apparatus according to claim 18, wherein the controller adjusts a completion time of the alignment in accordance with confidence output from a processing apparatus.

20. A method of manufacturing an article, comprising:
forming a pattern on a substrate by using a lithography apparatus defined in claim 18;
processing the substrate which has undergone the forming; and
obtaining the article from the substrate which has undergone the processing.

21. A model that generates information indicating confidence of position information of a measurement target in a first direction generated based on image data of the measurement target,
wherein the model is configured to generate the information by determining, based on a feature quantity of the image data of the measurement target related to a second direction different from the first direction, the confidence of the position information of the measurement target in the first direction, and
wherein the measurement target is a mark that is detected to obtain the position information in the first direction.

22. A processing method of image data of a measurement target for measuring a position, comprising:
generating, based on the image data of the measurement target, position information of the measurement target in a first direction; and
determining, based on a feature quantity of the image data of the measurement target related to a second direction different from the first direction, confidence of the position information of the measurement target in the first direction generated in the generating,
wherein the measurement target is a mark that is detected to obtain the position information in the first direction.

23. A measurement method for measuring a position of a measurement target, comprising:
capturing an image of the measurement target to generate image data;
generating, based on the image data of the measurement target, position information of the measurement target in a first direction; and
determining, based on a feature quantity of the image data of the measurement target related to a second direction different from the first direction, confidence of the position information of the measurement target in the first direction generated in the generating,
wherein the measurement target is a mark that is detected to obtain the position information in the first direction.

24. A generation method of generating a model for determining confidence of position information of a measurement target in a first direction generated based on image data of the measurement target, comprising:
obtaining a feature quantity of the image data of the measurement target related to a second direction different from the first direction;
obtaining a measurement value of an error included in the position information of the measurement target in the first direction; and generating a model by performing machine learning by setting the feature quantity as input data of the model and setting the measurement value of the error as training data, wherein the measurement target is a mark that is detected to obtain the position information in the first direction.

25. A generation apparatus that generates a model for determining confidence of position information of a measurement target in a first direction generated based on image data of the measurement target, wherein a feature quantity of the image data of the measurement target related to a second direction different from the first direction and a measurement value of an error included in the position information of the measurement target in the first direction are obtained, the model is generated by performing machine learning by setting the feature quantity as input data of the model and the measurement value of the error as training data, and wherein the measurement target is a mark that is detected to obtain the position information in the first direction.

\* \* \* \* \*